(12) United States Patent
Aoai et al.

(10) Patent No.: US 6,245,485 B1
(45) Date of Patent: Jun. 12, 2001

(54) POSITIVE RESIST COMPOSITION

(75) Inventors: Toshiaki Aoai; Shunichi Kondo, both of Shizuoka; Tsuguo Yamaoka, Chiba; Kenichiro Sato, Shizuoka, all of (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/075,818

(22) Filed: May 12, 1998

(30) Foreign Application Priority Data

May 12, 1997 (JP) .................................. 9-120919
Sep. 25, 1997 (JP) .................................. 9-260399

(51) Int. Cl.$^7$ .................................. G03C 1/73
(52) U.S. Cl. .................................. 430/288.1; 430/287.1; 430/906; 430/910
(58) Field of Search .................................. 430/288.1, 287.1, 430/906, 910

(56) References Cited

U.S. PATENT DOCUMENTS

| 5,585,222 | * | 12/1996 | Kaimoto et al. | 430/296 |
| 5,658,708 | * | 8/1997 | Kondo | 430/288.1 |
| 5,738,975 | * | 4/1998 | Nakano et al. | 430/280.1 |
| 5,851,727 | * | 12/1998 | Choi et al. | 430/270.1 |

FOREIGN PATENT DOCUMENTS

| 195 25 221 | 1/1996 | (DE) . |
| 0 663 616 | 7/1995 | (EP) . |
| 0 690 348 | 1/1996 | (EP) . |
| 0 789 278 | 8/1997 | (EP) . |
| 0 877 293 | 11/1998 | (EP) . |

OTHER PUBLICATIONS

Wallraff et al, "Single–layer chemically amplified photoresists for 193–nm lithography", Journal of Vacuum Science & Technology B, vol. 11, No. 6, pp. 2783–2788, (1993).

* cited by examiner

Primary Examiner—Mark F. Huff
Assistant Examiner—Yvette M. Clarke
(74) Attorney, Agent, or Firm—Sughrue, Mion, Zinn, Macpeak & Seas, PLLC

(57) ABSTRACT

Disclosed is a positive resist composition which ensures, on use of an exposure light source of 220 nm or less, high sensitivity, good resolution, sufficiently high resistance against dry etching, satisfactory adhesion to the substrate, and superior developability even with a developer conventionally used for resists (for example, a 2.38% aqueous tetramethylammonium hydroxide solution), the positive resist composition comprising a compound generating an acid on irradiation of an active light ray or radiation, a resin having a polycyclic-type alicyclic group and a carboxyl group, and a compound having at least two groups having a specific structure.

7 Claims, No Drawings

POSITIVE RESIST COMPOSITION

FIELD OF THE INVENTION

The present invention relates to a positive resist composition for use in the production process of a semiconductor such as IC, in the production of a circuit board such as liquid crystal and thermal head and in other photofabrication processes, more specifically, the present invention relates to a positive resist composition suitable for the case where the exposure light source used is a far ultraviolet ray of 220 nm or less.

BACKGROUND OF THE INVENTION

The positive photoresist composition commonly used is a composition comprising an alkali-soluble resin and a. naphthoquinonediazide compound as a photosensitive material. Examples thereof include a "novolak-type phenol resin/naphthoquinonediazide-substituted compound" described in U.S. Pat. Nos. 3,666,473, 4,115,128 and 4,173,470 and a "novolak resin comprising cresol-formaldehyde/trihydroxybenzophenone-1,2-naphthoquinonediazide sulfonic acid ester" as a most typical composition, described in L. F. Thompson, *Introduction to Microlithography*, No. 2. 19, pp. 112–121, ACS Shuppan.

In these positive photoresists fundamentally comprising a novolak resin and a quinonediazide compound, the novolak resin exhibits high resistance against plasma etching and the naphthoquinonediazide compound acts as a dissolution inhibitor. The naphthoquinonediazide generates a carboxylic acid on irradiation of light and loses its dissolution inhibiting ability to thereby elevate the alkali solubility of the novolak resin.

From this viewpoint, a large number of positive photoresists comprising a novolak resin and a naphthoquinonediazide-base photosensitive material have heretofore been developed and used in practice, and satisfactory effects can be successfully attained in the working for the line width of approximately from 0.8 to 2 μm.

However, integrated circuits are being more and more intensified in the integration degree and the production of a semiconductor substrate such as VLSI requires working of an ultrafine pattern comprising lines having a width of a half micron or less.

According to one of known techniques for achieving miniaturization of a pattern, a resist pattern is formed using an exposure light source having a shorter wavelength. This technique can be described using the following Rayleigh's formula for the resolution R (line width) of an optical system:

$$R = k \cdot \lambda / NA$$

(wherein λ is a wavelength of the exposure light source, NA is a numerical aperture of the lens and k is a process constant). As known from this formula, a higher resolution, namely, a smaller R value can be obtained by reducing the wavelength λ of the exposure light source.

For example, in the production of a DRAM having an integration degree up to 64 M bits, the i-line (365 nm) of a high-pressure mercury lamp is used at present as the light source. In the mass production process of 256-M bit DRAMs, use of a KrF excimer laser (248 nm) in place of the i-line is being studied. Further, for producing DRAMs having an integration degree of 1 G bits or more, a light source having a further shorter wavelength is being studied. To this effect, an ArF excimer laser (193 nm), an $F_2$ excimer laser (157 nm), an X ray, an electron beam and the like are considered to be effective (see, Takumi Ueno et al., *Tanhacho Photoresist Zairyo -ULSI Ni Muketa Bisai Kako- (Short Wavelength Photoresist Material -Fine Working Toward ULSI-)*, Bunshin Shuppan (1988).

When a conventional resist comprising a novolak and a naphthoquinonediazide compound is used for the lithography pattern formation using a far ultraviolet ray or excimer laser beam, the novolak and naphthoquinonediazide exhibit strong absorption in the far ultraviolet region and the light scarcely reaches the resist bottom, as a result, only a tapered pattern having low sensitivity can be obtained.

One of the techniques for solving this problem is the chemical amplification-type resist composition described in U.S. Pat. No. 4,491,628 and European Patent No. 249,139. The chemical amplification-type positive resist composition is a pattern formation material which produces an acid in the exposed area on irradiation of radiation such as far ultraviolet ray and due to the reaction using this acid as a catalyst, differentiates the solubility in the developer between the area irradiated with the active radiation and the non-irradiated area to form a pattern on a substrate.

Examples thereof include combinations of a compound capable of generating an acid by the photolysis with an acetal or O,N-acetal compound (see, JP-A-48-89003 (the term "JP-A" as used herein means an "unexamined published Japanese patent application"), with an ortho ester or amide acetal compound (JP-A-51-120714), with a polymer having an acetal or ketal group on the main chain (JP-A-53-133429), with an enol ether compound (JP-A-55-12995), with an N-acyliminocarbonic acid compound (JP-A-55-126236), with a polymer having an ortho ester group on the main chain (JP-A-56-17345), with a tertiary alkyl ester compound (JP-A-60-3625), with a silyl ester compound (JP-A-60-10247) or with a silyl ether compound (JP-A-60-37549, JP-A-60-121446). These combinations in principle have a quantum yield exceeding 1 and therefore exhibit high photosensitivity.

A system which decomposes by heating in the presence of an acid and is alkali-solubilized is also used and examples thereof include combination systems of a compound capable of generating an acid on exposure with an ester or carbonic acid ester compound of tertiary or secondary carbon (e.g., t-butyl, 2-cyclohexenyl) described in JP-A-59-45439, JP-A-60-3625, JP-A-62-229242, JP-A-63-27829, JP-A-63-36240, JP-A-63-250642, JP-A-5-181279, *Polym. Eng. Sce.,* Vol. 23, page 1012 (1983), *ACS. Sym.,* Vol. 242, page 11 (1984), *Semiconductor World* 1987. November, page 91, *Macromolecules*, Vol. 21, page 1475 (1988), and *SPIE*, Vol. 920, page 42 (1988), with an acetal compound described in JP-A-4-219757, JP-A-5-249682 and JP-A-6-65332, or with a t-butyl ether compound described in JP-A-4-211258 and JP-A-6-65333.

These systems mainly comprise a resin having a basic skeleton of poly(hydroxystyrene) which is small in the absorption in the region of 248 nm and therefore, when the exposure light source is a KrF excimer laser, they are highly sensitive, highly resolving and capable of forming a good pattern and can be a good system as compared with conventional naphthoquinonediazide/novolak resin systems.

However, when the light source has a further shorter wavelength, for example, when the exposure light source used is an ArF excimer laser (193 nm), the above-described chemical amplification type systems are still deficient because the compound having an aromatic group substantially exhibits large absorption in the region of 193 nm. As the polymer having small absorption in the 193 nm region,

*J. Vac. Sci. Technol.*, B9, 3357 (1991) describes the use of poly(meth)acrylate, however, this polymer has a problem that the resistance against dry etching which is commonly performed in the production process of semiconductors is low as compared with conventional phenol resins having an aromatic group.

*Proc. of SPIE*, 1672, 66 (1922) has reported that polymers having an alicyclic group exhibit a dry etching resistant property on the same level as that of the compound having an aromatic group and at the same time, has small absorption in the 193 nm region, and use of these polymers is being aggressively studied in recent years. Specific examples thereof include the polymers described in JP-A-4-39665, JP-A-5-80515, JP-A-5-265212, JP-A-5-297591, JP-A-5-346668, JP-A-6-289615, JP-A-6-324494, JP-A-7-49568, JP-A-7-185046, JP-A-7-191463, JP-A-7-199467, JP-A-7-234511, JP-A-7-252324 and JP-A-8-259626. The polymers having an alicyclic group described in these publications use a carboxyl group in place of a phenolic OH group as the group of imparting solubility in an alkali developer so as to reduce the absorption in the 193 nm region. However, the carboxyl group has large solubility in a developer and with a developer hitherto used for resist materials (for example, a 2.38% aqueous tetramethylammonium hydroxide solution), even the unexposed area dissolves at the development to cause a problem of film thickness loss.

In order to solve this problem, it is necessary to dilute the developer and reduce the concentration or to reduce the carboxyl group content in the polymer. When the developer concentration is reduced, the reproducibility by the development becomes a problem, and when the carboxyl group content in the polymer is reduced, the polymer is intensified in the hydrophobic property and the adhesion to the substrate is disadvantageously deteriorated.

SUMMARY OF THE INVENTION

Accordingly, the object of the present invention is to provide a positive resist composition suitable for the exposure using a light source of 220 nm or less, particularly an ArF excimer laser beam (193 nm). More specifically, the object of the present invention is to provide a positive resist composition which ensures, on use of an exposure light source of 220 nm or less, high sensitivity, good resolution, sufficiently high resistance against dry etching, satisfactory adhesion to the substrate, and superior developability even with a developer conventionally used for resists (for example, a 2.38% aqueous tetramethylammonium hydroxide solution).

As a result of extensive investigations while taking notice of the above-described various properties, the present inventors have found that the object of the present invention can be successfully attained by using a resin having a specific structure and a polyfunctional enol ether compound having a specific structure. The present invention has been accomplished based on this finding.

More specifically, the present invention has the following constructions.

(1) A positive resist composition comprising (A) a compound generating an acid on irradiation of an active light ray or radiation, (B) a resin having a polycyclic-type alicyclic group and a carboxyl group, and (C) a compound having at least two groups represented by the following formula (I):

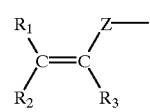

wherein $R_1$, $R_2$ and $R_3$ may be the same or different and each represents a hydrogen atom or an alkyl group or cycloalkyl group which may have a substituent or two of $R_1$ to $R_3$ may be combined to form a ring structure comprising from 3 to 8 carbon atoms or hetero atoms; and Z represents an oxygen atom, a sulfur atom, $-SO_2-$ or $-NH-$.

(2) The positive resist composition as described in (1) above, wherein the resin as component (B) has at least one repeating structural unit having a polycyclic-type alicyclic group on the side chain thereof, represented by the following formula (XXII), (XXIII) or (XXIV):

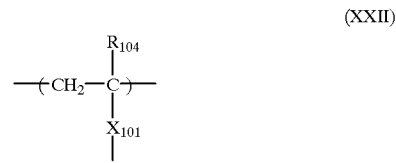

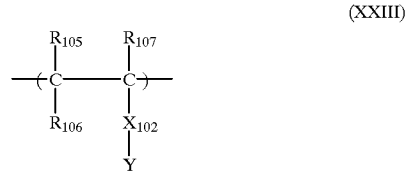

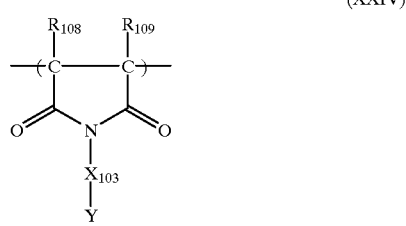

wherein $R_{104}$, $R_{105}$, $R_{107}$, $R_{108}$ and $R_{109}$ may be the same or different and each represents a hydrogen atom, a halogen atom, a cyano group, an alkyl group or haloalkyl group which may have a substituent; $R_{106}$ represents a cyano group, $-CO-OR_{110}$ or $-CO-N(R_{111})(R_{112})$; $X_{101}$, $X_{102}$ and $X_{103}$ may be the same or different and each represents a single bond, a divalent alkylene group, alkenylene group or cycloalkylene group which may have a substituent, $-O-$, $-SO_2-$, $-O-CO-R_{113}-$, $-CO-O-R_{114}-$ or $-CO-N(R_{115})-R_{116}-$; $R_{110}$ represents a hydrogen atom, an alkyl group, cycloalkyl group or alkenyl group which may have a substituent, or a group capable of decomposing by the action of an acid to increase solubility in an alkali developer; $R_{111}$, $R_{112}$ and $R_{115}$ may be the same or different and each represents a hydrogen atom, an alkyl group, cycloalkyl group or alkenyl group which may have a substituent, or $R_{111}$ and $R_{112}$ may be combined to form a ring; $R_{113}$, $R_{114}$ and $R_{116}$ may be the same or different and each represents a single bond or a divalent alkylene group, alkenylene group or cycloalkylene group which may have an ether group, an ester group, an amido group, a urethane group or a ureido group; and Y represents a polycyclic-type alicyclic group.

(3) The positive resist composition as described in (1) above, wherein the resin as component (B) is a polycycloolefin resin having an alicyclic group on the main chain and having a carboxyl group.

(4) The positive resist composition as described in (1) above, wherein the resin as component (B) further contains a group capable of decomposing by the action of an acid to increase solubility in an alkali developer.

(5) The positive resist composition as described in (1) above, wherein the resin as component (B) contains at least one repeating structural unit having an alicyclic group on the main chain, represented by the following formula (II) or (III), and a carboxyl group;

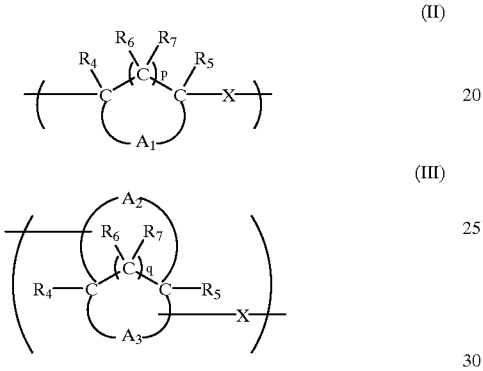

wherein $R_4$, $R_5$, $R_6$ and $R_7$ each independently represents a hydrogen atom, a halogen atom, a cyano group, a hydroxy group, an alkyl group, a haloalkyl group, an alkoxy group, —CO—$OR_{38}$ or a carboxy group, or at least two of $R_4$ to $R_7$ may be combined to form an alkylene group having from 1 to 5 carbon atoms which may contain a hetero atom; $R_{38}$ represents an alkyl group, cycloalkyl group or alkenyl group which may have a substituent, or a group capable of decomposing by the action of an acid; $A_1$, $A_2$ and $A_3$ each independently represents a divalent alkylene group, alkenylene group or monocyclic or polycyclic cycloalkylene group which may have a substituent; X represents a single bond, a divalent alkylene group, an alkenylene group or —$SO_2$—; and p and q each independently represents 0 or an integer of from 1 to 4.

(6) The positive resist composition as described in (5) above, wherein the repeating structural unit having an alicyclic group on the main chain, represented by formula (II) or (III), is a repeating structural unit represented by the following formula (IV), (V), (VI), (VII) or (VIII):

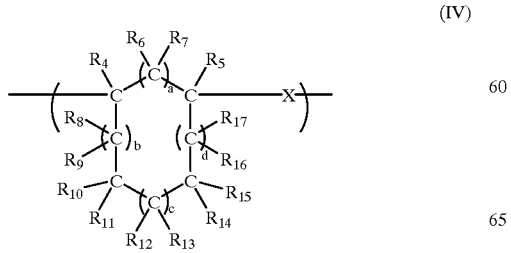

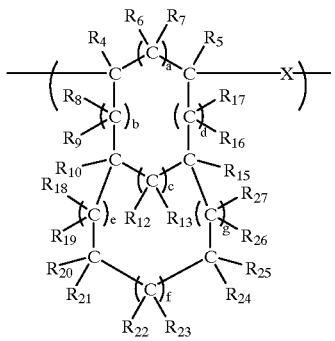

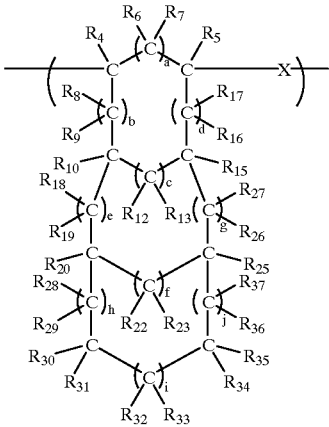

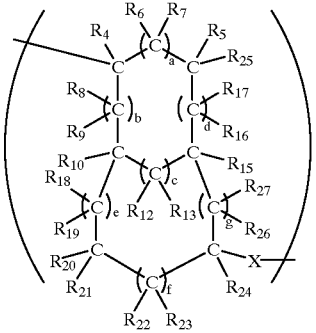

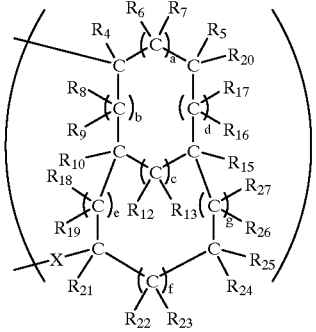

wherein $R_4$ to $R_7$, $R_{38}$ and X each has the same meaning as defined in (5) above; $R_8$ to $R_{37}$ each independently represents a hydrogen atom, a halogen atom, a hydroxy group, an alkoxy group, an alkyl group, a cycloalkyl group, an alkenyl group, —CO—$OR_{38}$ or a carboxy group; a to j each independently represents 0 or an integer of from 1 to 4; and at least two of $R_4$ to $R_{17}$ in formula (IV), at least two of $R_4$ to $R_{10}$, $R_{12}$, $R_{13}$, and $R_{15}$ to $R_{27}$ in formula (V), (VII) or (VIII), or at least two of $R_4$ to $R_{10}$, $R_{12}$, $R_{13}$, $R_{15}$ to $R_{20}$, $R_{22}$, $R_{23}$ and $R_{25}$ to $R_{37}$ in formula (VI) may be combined to form an alkylene group having from 1 to 5 carbon atoms, which may contain a hetero atom.

(7) The positive resist composition as described in (1) above, wherein the resin as component (B) contains at least one repeating structural unit having a carboxyl group, represented by the following formula (IX), (X) or (XI):

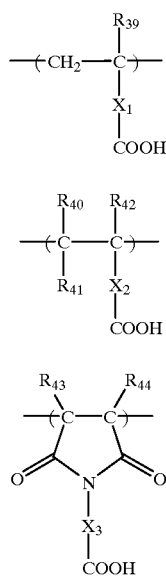

wherein $R_{39}$ to $R_{40}$ and $R_{42}$ to $R_{44}$ each independently represents a hydrogen atom, a halogen atom, a cyano group, an alkyl group or a haloalkyl group; $R_{41}$ represents a cyano group, $-CO-OR_{38}$ or $-CO-NR_{45}R_{46}$; $X_1$ to $X_3$ each independently represents a single bond, a divalent alkylene group, alkenylene group or cycloalkylene group which may have a substituent, $-O-$, $-SO_2-$, $-O-CO-R_{47}-$, $-CO-O-R_{48}-$ or $-CO-NR_{49}-R_{50}-$; $R_{38}$ has the same meaning as defined in (5) above; $R_{45}$, $R_{46}$ and $R_{49}$ each independently represents a hydrogen atom, an alkyl group, cycloalkyl group or alkenyl group which may have a substituent and $R_{45}$ and $R_{46}$ may be combined to form a ring; $R_{47}$, $R_{48}$ and $R_{50}$ each independently represents a single bond, a divalent alkylene group, an alkenylene group, a cycloalkylene group or a divalent group formed therefrom together with at least one of an ether group, an ester group, an amido group, a urethane group or a ureido group.

(8) The positive resist composition as described in (1) above, wherein the resin as component (B) has a group represented by the following formula (XII) or (XIII):

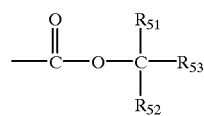

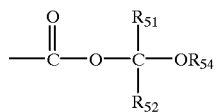

wherein $R_{51}$ to $R_{53}$ each independently represents a hydrogen atom or an alkyl group, cycloalkyl group, alkenyl group, acyl group or alkoxycarbonyl group which may have a substituent, and $R_{54}$ represents an alkyl group, cycloalkyl group or alkenyl group which may have a substituent, provided that at least two of $R_{51}$ to $R_{53}$ in formula (XII) are a group other than a hydrogen atom or two of $R_{51}$ to $R_{53}$ in formula (XII) or two of $R_{51}$, $R_{52}$ and $R_{54}$ in formula (XIII) may be combined to form a ring structure comprising from 3 to 8 carbon atoms or hetero atoms.

(9) The positive resist composition as described in (1) above, wherein the resin as component (B) has a hydroxyl group.

(10) The positive resist composition as described in (1) above, wherein the compound as component (C) is a compound represented by the following formula (XIV):

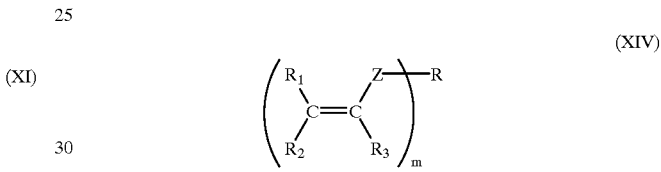

wherein $R_1$ to $R_3$ and Z each has the same meaning as defined in (1) above, R represents an m-valent alkylene group, m-valent cycloalkylene group or m-valent group obtained by combining two or more of these groups, which may contain a hetero atom and may form a divalent or greater valent linking group together with at least one of an ether group, an ester group, an amido group, a urethane group or a ureido group, and m represents an integer of 2 or more.

(11) The positive resist composition as described in (1) above, wherein the resin as component (B) and the compound as component (C) are crosslinked by the heating at the film formation and insolubilized in an alkali developer, and the crosslinked product of the resin as component (B) and the compound as component (C) is decomposed by the acid generated on irradiation of an active light ray or radiation to increase the solubility in an alkali developer.

(12) The positive resist composition as described in (1) above, wherein a far ultraviolet ray of 220 nm or less is used as the exposure light source.

The resin as component (B) for use in the present invention is addition-reacted with the compound as component (C) of the present invention, for example, a polyvalent enol ether compound with the carboxyl group (and hydroxyl group) in the resin as component (B), by the heat drying at the film formation of the composition to thereby cause crosslinking. Due to this, the unexposed area is insolubilized in an alkali developer while maintaining adhesion to the substrate, and therefore, overdevelopment (film thinning) by the carboxyl group does not occur. At the exposed area, the acetal group-crosslinked part decomposes together with an acid decomposable group which is introduced if desired, by the acid generated and sufficiently high developability is exhibited for the alkali developer. As a result, a large discrimination in the dissolution can be attained. Such a technique of forming a positive image by causing crosslinking and thereafter decomposing it making use of the thermal addition reaction between an enol ether group and a carboxyl group is described in JP-A-6-148889 and JP-A-6-230574, however, the system used in these publications has a large absorption in the region of 220 nm or less, particularly an ArF excimer laser ray (193 nm), and further, the resistance against dry etching is not sufficient.

According to the present invention, this problem can be successively solved and a positive resist composition showing small absorption to the far ultraviolet ray having a wavelength of 220 nm or less (particularly ArF excimer ray) and excellent resistance against dry etching can be provided.

DETAILED DESCRIPTION OF THE INVENTION

The compounds for use in the present invention are described in detail below, however, the present invention is by no means limited thereto.

[1] Resin as Component (B)

The resin as component (B) is a resin having a polycyclic-type alicyclic group and a carboxyl group. The structural unit having a polycyclic-type alicyclic group in the resin as component (B) is preferably a repeating structural unit having a polycyclic-type alicyclic group on the side chain thereof, represented by formula (XXII), (XXIII) or (XXIV).

In the resin as component (B), the carboxyl group may be contained in the repeating structural unit represented by formula (XXII), (XXIII) or (XXIV) or may be contained in a repeating structural unit different therefrom. Further, the carboxyl group may be contained at a plurality of substitution sites. The structural unit having a carboxyl group is preferably a repeating structural unit represented by formula (IX), (X) or (XI).

The resin as component (B) preferably contains a hydroxy group and/or a group which decomposes by the action of an acid to increase the solubility in an alkali developer (sometimes referred to as an acid decomposable group). By containing the group, discrimination in the dissolution in an alkali developer can be more intensified.

The hydroxy group and the acid decomposable group may also be contained in the repeating structural unit represented by formula (XXII), (XXIII), (XXIV), (IX), (X) or (XI), or may be contained in a repeating structural unit different therefrom. Further, the group may be contained at a plurality of substitution sites.

In formulae (XXII) to (XXIV), the alkyl group represented by $R_{104}$, $R_{105}$, $R_{107}$, $R_{108}$ or $R_{109}$ is preferably an alkyl group having from 1 to 4 carbon atoms, which may have a substituent, such as methyl group, ethyl group, propyl group, n-butyl group or sec-butyl group. The haloalkyl group is preferably an alkyl group having from 1 to 4 carbon atoms substituted by a fluorine atom, a chlorine atom or a bromine atom, such as fluoromethyl group, chloromethyl group, bromomethyl group, fluoroethyl group, chloroethyl group or bormoethyl group.

The alkyl group represented by $R_{110}$, $R_{111}$, $R_{112}$ or $R_{115}$ is preferably an alkyl group having from 1 to 8 carbon atoms, which may have a substituent, such as methyl group, ethyl group, propyl group, n-butyl group, sec-butyl group, hexyl group, 2-ethylhexyl group or octyl group. The cycloalkyl group is preferably a monocyclic cycloalkyl group having from 3 to 8 carbon atoms, which may have a substituent, such as cyclopropyl group, cyclopentyl group or cyclohexyl group, or a polycyclic cycloalkyl group such as adamantyl group, norbornyl group, isoboronyl group, dicyclopentyl group, σ-pinel group or tricyclodecanyl group.

The alkenyl group is preferably an alkenyl group having from 2 to 6 carbon atoms, which may have a substituent, such as vinyl group, propenyl group, allyl group, butenyl group, pentenyl group, hexenyl group or cyclohexenyl group.

$R_{111}$ and $R_{112}$ may be combined to form a ring together with the nitrogen atom. The ring formed therefrom is preferably a 5-, 6-, 7- or 8-membered ring such as pyrrolidine, piperidine or piperazine.

The alkylene group represented by $X_{101}$, $X_{102}$ or $X_{103}$ is preferably an alkylene group having from 1 to 8 carbon atoms, which may have a substituent, such as methylene group, ethylene group, propylene group, butylene group, hexylene group or octylene group. The alkneylene group is preferably an alkenylene group having from 2 to 6 carbon atoms, which may have a substituent, such as ethenylene group, propenylene group or butenylene group. The cycloalkylene group is preferably a cycloalkylene group having from 5 to 8 carbon atoms, which may have a substituent, such as cyclopentylene group or cyclohexylene group.

Specific examples of the alkylene group, the alkenylene group and the cycloalkylene group represented by $R_{113}$, $R_{114}$ or $R_{116}$ include the groups described above with respect to $X_{101}$ to $X_{103}$, and further include a divalent group formed from the group together with at least one of an ether group, an ester group, an amido group, a urethane group or a ureido group.

The acid decomposable group which is preferably introduced into the resin as component (B) of the present invention and the acid decomposable group represented by $R_{110}$ are a group capable of decomposing by the action of an acid to increase the solubility in an alkali developer. Examples thereof include a group which is hydrolyzed by the action of an acid to form an acid and a group which releases the carbon cation by the action of an acid to form an acid. The acid decomposable group is preferably a group represented by formula (XII) or (XIII).

The polycyclic-type alicyclic group contained in the resin as component (B) is preferably an alicyclic group having 5 or more carbon atoms, which may have a substituent, such as bicyclo-, tricyclo- or tetracyclo-alicyclic group, more preferably a polycyclic-type alicyclic group having from 6 to 30 carbon atoms, still more preferably from 7 to 25 carbon atoms, which may have a substituent.

Preferred examples of the substituent of the polycyclic-type alicyclic group include a hydroxyl group, a halogen atom (e.g., fluorine, chlorine, bromine, iodine), a nitro group, a cyano group, an amido group, a sulfonamido group, the alkyl groups described above for $R_{110}$ to $R_{114}$ or $R_{115}$, an alkoxy group having from 1 to 8 carbon atoms, such as methoxy group, ethoxy group, hydroxyethoxy group, propoxy group, hydroxypropoxy group and butoxy group, an alkoxycarbonyl group such as methoxycarbonyl group and ethoxycarbonyl group, an acyl group such as formyl group, acetyl group and benzoyl group, an acyloxy group such as acetoxy group and butyryloxy group, and a carboxy group.

Representative structures of the polycyclic-type alicyclic moiety in the polycyclic-type alicyclic group are set forth below.

(1)

(2)
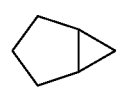
(3)
(4)
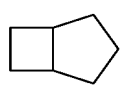
(5)
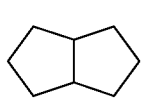
(6)
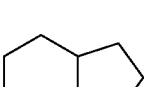
(7)
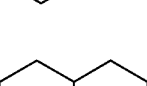
(8)
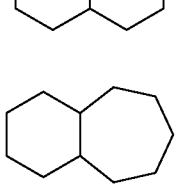
(9)
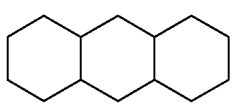
(10)
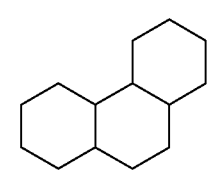
(11)
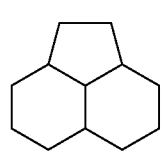
(12)
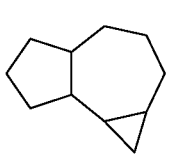
(13)
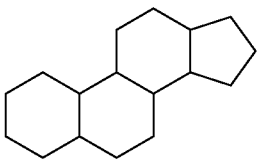
(14)
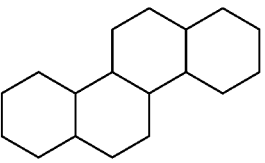
(15)
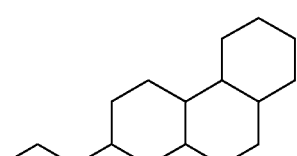
(16)
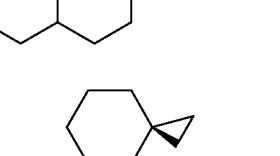
(17)
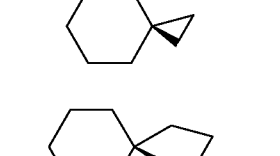
(18)
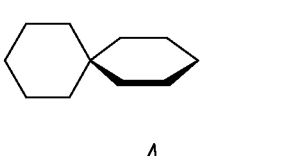
(19)(20)
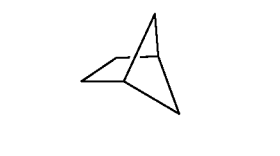
(21)(22)
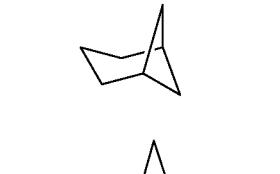
(23)

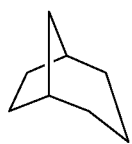 (24)
 (25)
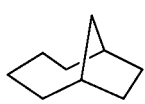 (26)
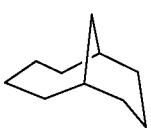 (27)
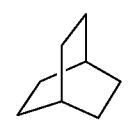 (28)
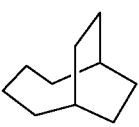 (29)
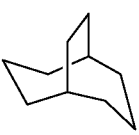 (30)
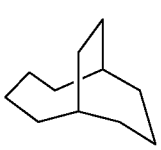 (31)
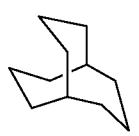 (32)
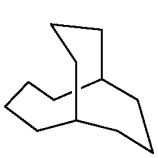 (33)
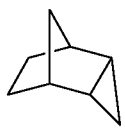 (34)
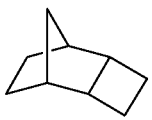 (35)
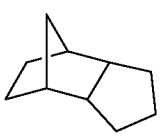 (36)
 (37)
 (38)
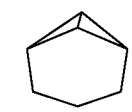 (39)
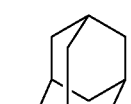 (40)
 (41)

(42) 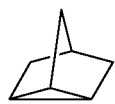

(43) 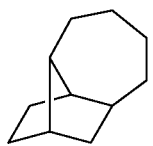

(44) 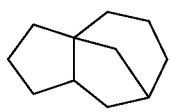

(45) 

(46) 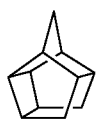

The content of the structural unit having the alicyclic group in the resin for use in the present invention (preferably the repeating structural unit represented by formula (XXII), (XXIII) or (XXIV)) is adjusted in view of the balance with the resistance against dry etching and the alkali developability, however, it is preferably 20 mol % or more, more preferably from 30 to 100 mol %, still more preferably from 40 to 90 mol %, and particularly preferably from 45 to 75 mol %, based on all repeating structural units.

Specific examples of the repeating structural units represented by formulae (XXII) to (XIV) are set forth below, however, the present invention is by no means limited thereto.

(a1) 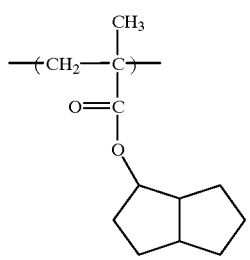

(a2) 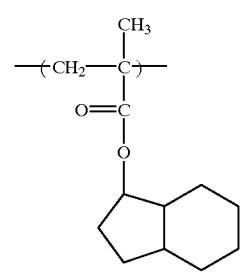

(a3) 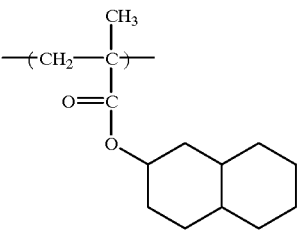

(a4) 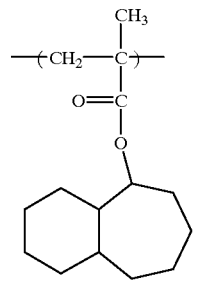

(a5) 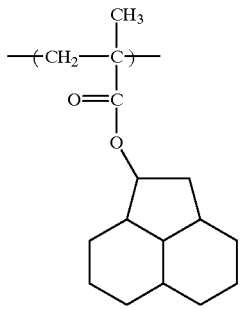

(a6) 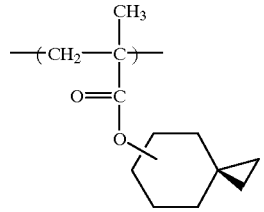

(a7) 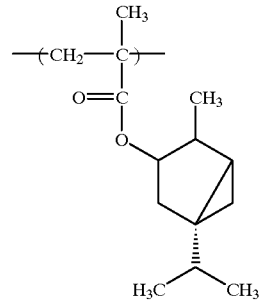

(a8)
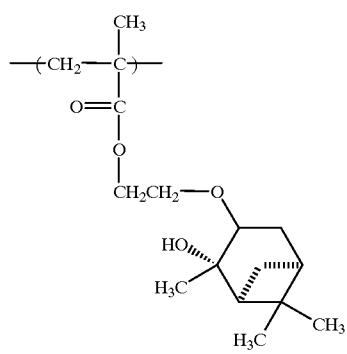
(a9)
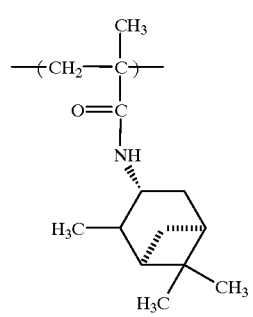
(a10)
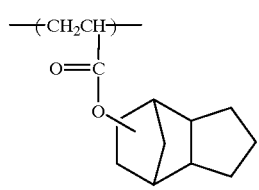
(a11)
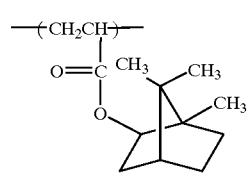
(a12)
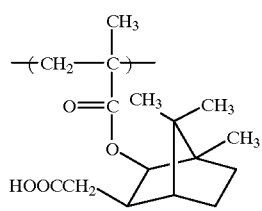
(a13)
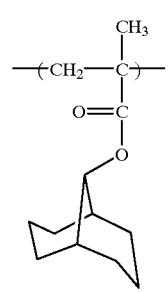
(a14)
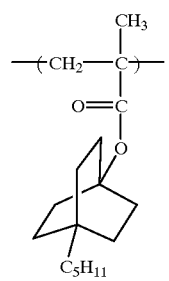
(a15)
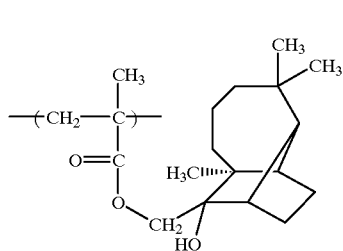
(a16)
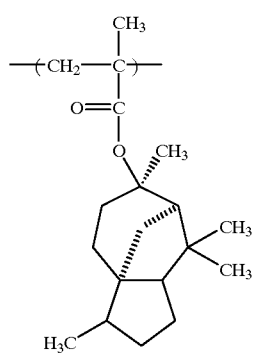
(a17)
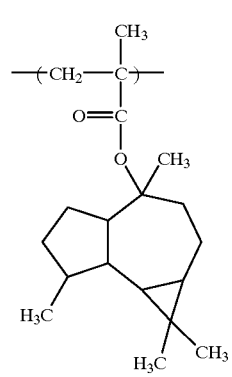
(a18)
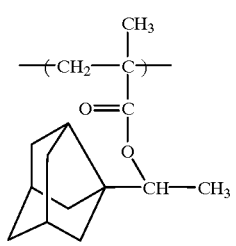

(a19)
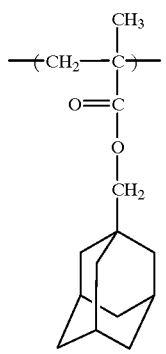
(a20)
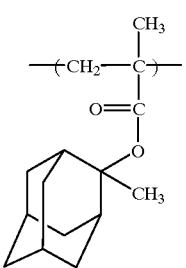
(a21)
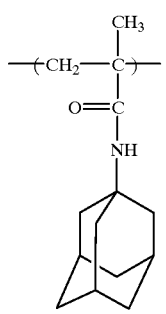
(a22)
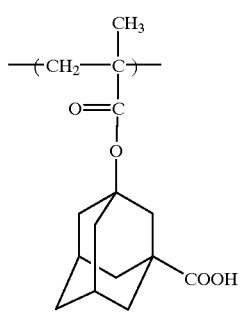
(a23)
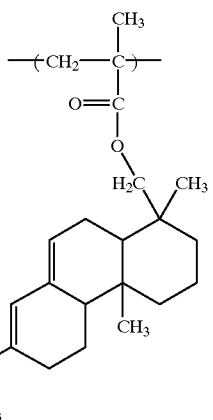
(a24)
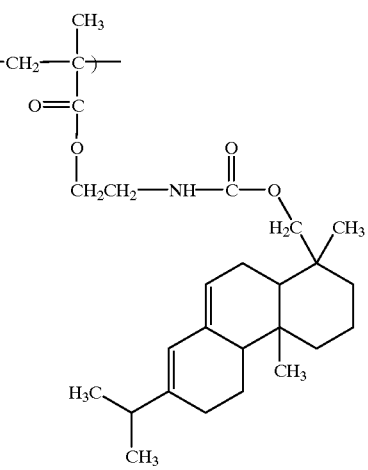
(a25)
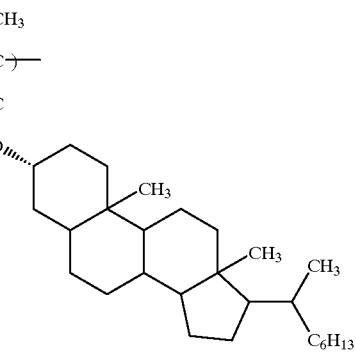

(a26)
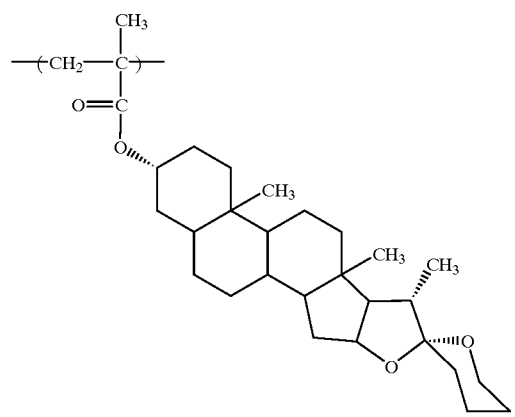
(a27)
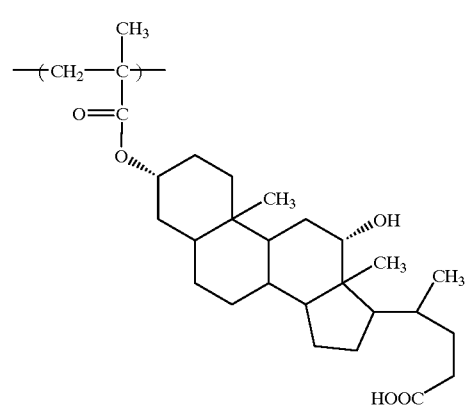
(a28)
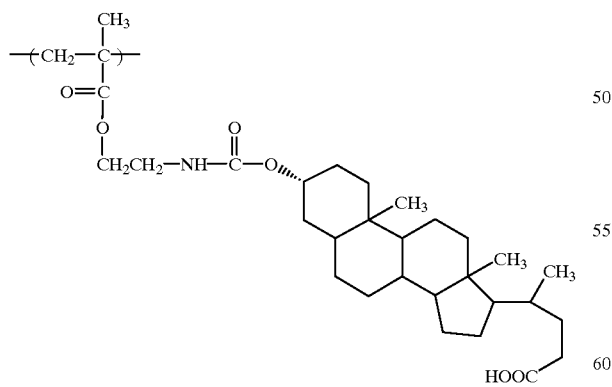
(a29)
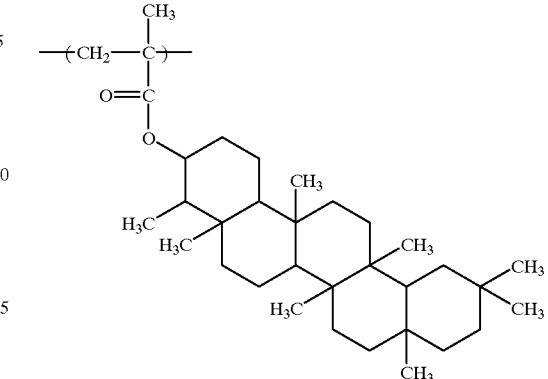
(a30)
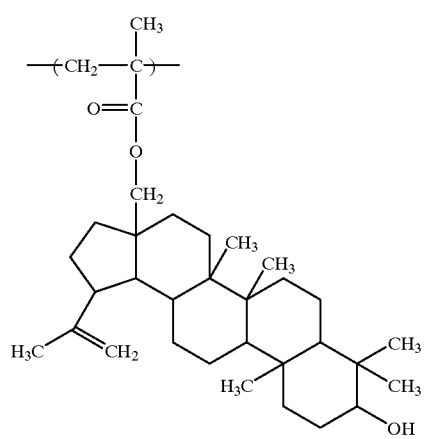
(a31)
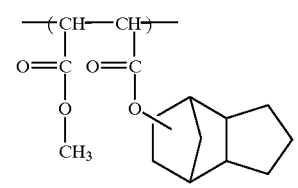
(a32)
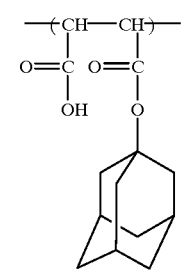
(a33)
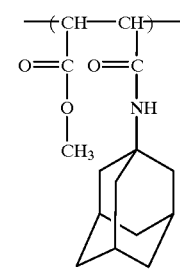

(a34) 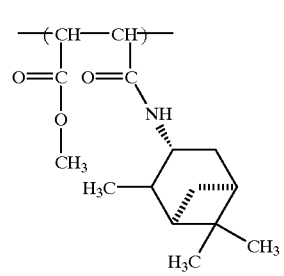
(a35) 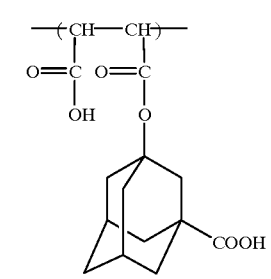
(a36) 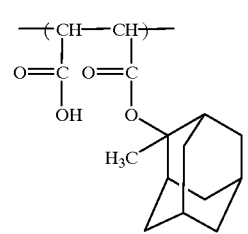
(a37) 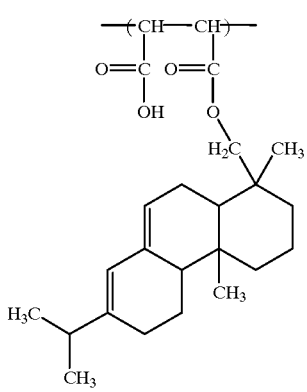
(a38) 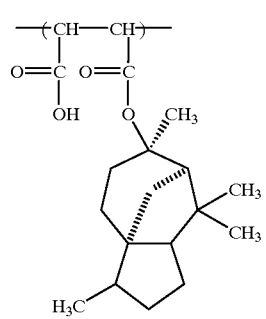
(a39) 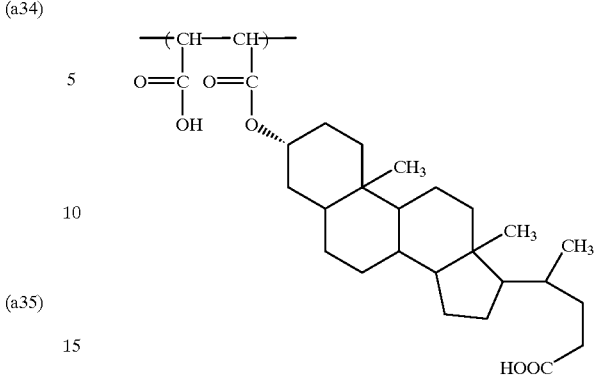
(a40) 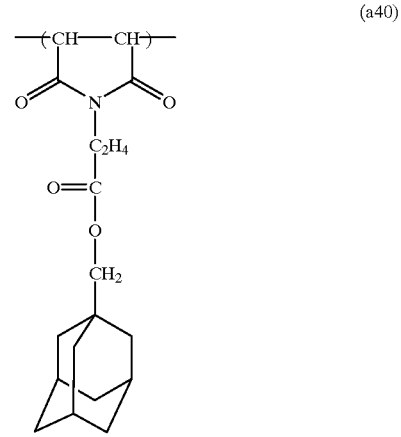
(a41) 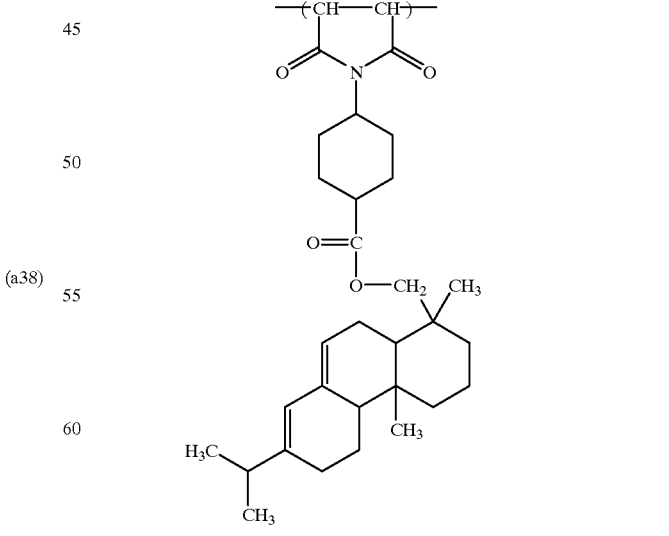

-continued

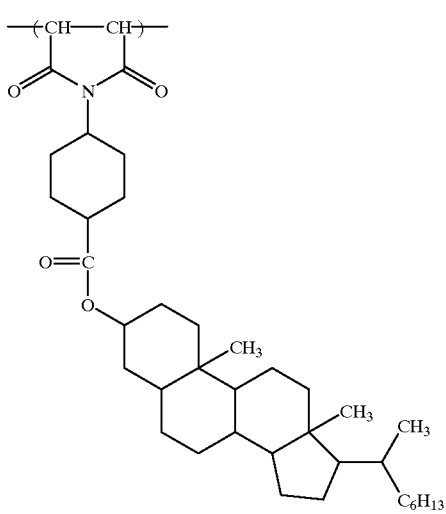
(a42)

According to another preferred embodiment, the resin as component (B) is a polycyclo-olefin resin having an alicyclic group on the main chain and further having a carboxyl group.

The alicyclic group contained in the main chain of the resin as component (B) may be either monocyclic or polycyclic and may or may not have a substituent. Specific examples thereof include divalent groups having 5 or more carbon atoms and having a monocyclo, bicyclo, tricyclo or tetracyclo-structure. The alicyclic group preferably has from 6 to 30 carbon atoms and a polycyclic-type alicyclic group having from 7 to 25 carbon atoms is most preferred.

Representative examples of the structure of the alicyclic moiety in the polycyclic-type alicyclic group constituting the main chain are set forth below.

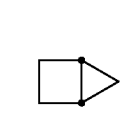
(1)

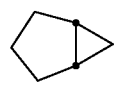
(2)

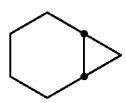
(3)

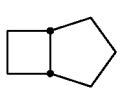
(4)

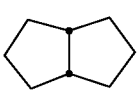
(5)

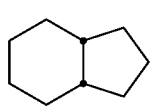
(6)

-continued

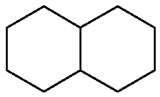
(7)

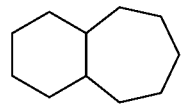
(8)

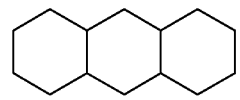
(9)

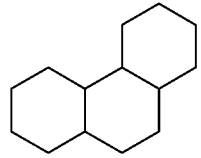
(10)

(11)

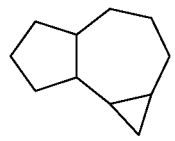
(12)

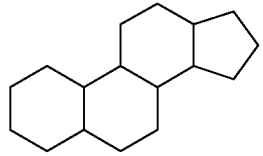
(13)

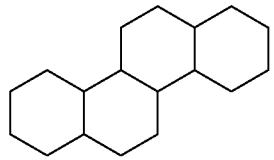
(14)

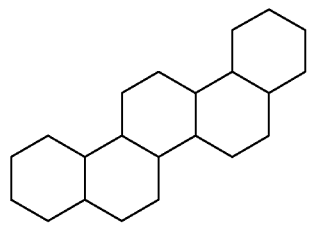
(15)

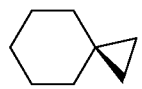
(16)

(17)
(18)
(19)
(20)
(21)
(22)
(23)
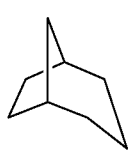
(24)
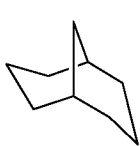
(25)
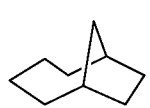
(26)
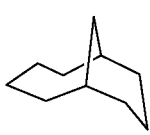
(27)
(28)
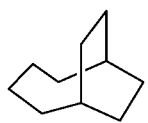
(29)
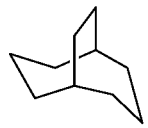
(30)

(40) 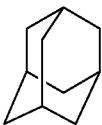

(41) 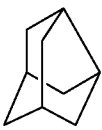

(42) 

(43) 

(44) 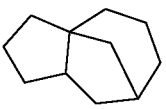

(45) 

(46) 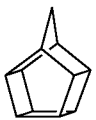

(47) 

(48) 

(49) 

(50) 

The repeating unit containing the alicyclic group constituting the main chain is preferably a repeating unit represented by formula (II) or (III), more preferably a repeating unit represented by-formula (IV), (V), (VI), (VII) or (VIII). The carboxyl group may be contained in the repeating structural unit represented by formula (II), (III), (IV), (V), (VI), (VII) or (VIII), or may be contained in a repeating unit different therefrom.

In addition, the resin as component (B) preferably contains a hydroxy group and/or an acid decomposable group. By containing the group, discrimination in the dissolution in an alkali developer can be more intensified. The acid decomposable group is a group capable of decomposing by the action of an acid to increase the solubility in an alkali developer. Examples thereof include a group which is hydrolyzed by the action of an acid to form an acid and a group which releases the carbon cation by the action of an acid to form an acid. The hydroxyl group and the acid decomposable group may be contained in the repeating unit represented by formula (II), (III), (IV), (V), (VI), (VII) or (VIII), or may be contained in a repeating unit different therefrom.

The carboxyl group, the hydroxyl group and the acid decomposable group each may be contained at a plurality of substitution sites and may be partially present or interspersed in the chained molecule.

In formulae (II) and (III), $R_4$ to $R_7$ each represents a hydrogen atom, a halogen atom, a cyano group, a hydroxy group, an alkyl group, a haloalkyl group, an alkoxy group, a group represented by —CO—$OR_{38}$, or a carboxy group.

The alkyl group represented by $R_4$, $R_5$, $R_6$ or $R_7$ includes, for example, an alkyl group having from 1 to 4 carbon atoms and preferred examples thereof include a methyl group, an ethyl group, a propyl group, a n-butyl group and a sec-butyl group. The haloalkyl group is an alkyl group partially or entirely substituted by a halogen atom, preferably by a fluorine atom, a chlorine atom or a bromine atom, and preferably has from 1 to 4 carbon atoms. Examples thereof include a fluoromethyl group, a chloromethyl group, a bromomethyl group, a fluoroethyl group, a chloroethyl group and a bromoethyl group. The alkoxy group includes, for example, an alkoxy group having from 1 to 8 carbon atoms and preferred examples thereof include a methoxy group, an ethoxy group, a hydroxyethoxy group, a propoxy group, a hydroxypropoxy group and a butoxy group. These alkyl and other groups each may or may not have a substituent. Any two of $R_4$ to $R_7$ may be combined to each other so that the combined entity can form an alkylene group having from 1 to 5 carbon atoms. The alkylene group may contain a hetero atom in the skeleton structure.

$R_{38}$ represents an alkyl group, a cycloalkyl group, an alkenyl group or an acid decomposable group. The alkyl group represented by $R_{38}$ includes, for example, an alkyl group having from 1 to 8 carbon atoms and preferred examples thereof include a methyl group, an ethyl group, a propyl group, an n-butyl group, a sec-butyl group, a hexyl group, a 2-ethylhexyl group and an octyl group. The cycloalkyl group may be either monocyclic or polycyclic. The monocyclic-type cycloalkyl group includes, for example, a cycloalkyl group having from 3 to 8 carbon atoms and preferred examples thereof include a cyclopropyl group, a cyclopentyl group and a cyclohexyl group. Preferred examples of the polycyclic-type cycloalkyl group include an adamantyl group, a norbornyl group, an isobornyl group, a dicyclopentyl group, a σ-pinel group and a tricyclodecanyl group. The alkenyl group includes, for example, an alkenyl group having from 2 to 6 carbon atoms and preferred examples thereof include a vinyl group, a propenyl group, an allyl group, a butenyl group, a pentenyl group, a hexenyl group and a cyclohexenyl group. These groups each may further have or may not have a substituent.

$A_1$ to $A_3$ each is a divalent group and examples thereof include an alkylene group, an alkenylene group and a cycloalkylene group. Specific examples thereof include an alkylene group having from 1 to 8 carbon atoms, an alkenylene group having from 2 to 6 carbon atoms and a cycloalkylene group having from 4 to 8 carbon atoms.

Preferred examples of the alkylene group represented by $A_1$, $A_2$ or $A_3$ include a methylene group, an ethylene group, a propylene group, a butylene group, a hexylene group and an octylene group. Preferred examples of the alkenylene group include an ethenylene group, a propenylene group and a butenylene group. Preferred examples of the cycloalkylene group include a cyclobutylene group, a cyclopentylene group, a cyclohexylene group and a norbornylene group. The alkenylene group, the alkenylene group and the cycloalkylene group each may further have or may not have a substituent.

The alkylene group represented by X includes, for example, an alkylene group having from 1 to 4 carbon atoms and preferred examples thereof include a methylene group and an ethylene group. The alkenylene group includes, for example, an alkenylene group having from 2 to 4 carbon atoms and preferred examples thereof include an ethenylene group, a propenylene group and a butenylene group. The alkylene group and the alkenylene group may further have or may not have a substituent.

In formulae (IV) to (VIII), $R_4$ to $R_7$ and X each has the same meaning as those defined above in formulae (II) to (III). $R_8$ to $R_{37}$ each represents a hydrogen atom, a halogen atom, a hydroxy group, an alkoxy group, an alkyl group, a cycloalkyl group, an alkenyl group, —CO—$OR_{38}$ or a carboxy group.

The alkyl group represented by each of $R_8$ to $R_{37}$ includes the same alkyl groups as those described above for $R_{38}$.

Examples of the cycloalkyl group, the alkenyl group, the alkoxy group and the —CO—$OR_{38}$ group include the same groups described above as the examples of respective groups for $R_4$ to $R_7$ in formula (II) to (III).

At least two of $R_4$ to $R_{17}$ in formula (IV), at least two of $R_4$ to $R_{10}$, $R_{12}$, $R_{13}$ and $R_{15}$ to $R_{27}$ in formulae (V), (VI) and (VIII), or at least two of $R_4$ to $R_{10}$, $R_{12}$, $R_{13}$, $R_{15}$ to $R_{20}$, $R_{22}$, $R_{23}$ and $R_{25}$ to $R_{37}$ in formula (VI) may be combined so that the combined entity can form an alkylene group having from 1 to 5 carbon atoms. In this case, the alkylene group may contain a hetero atom in the skeleton structure.

Specific examples of the repeating structural units represented by formulae (IV) to (VIII) are set forth below, however, the present invention is by no means limited thereto.

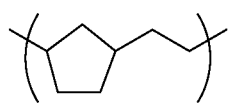

(a'1)

(a'2)

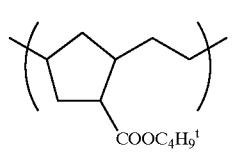

(a'3)

-continued

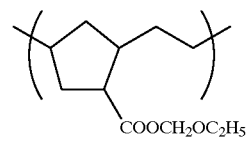

(a'4)

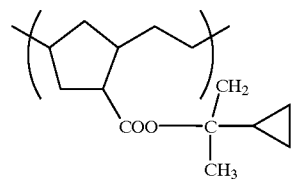

(a'5)

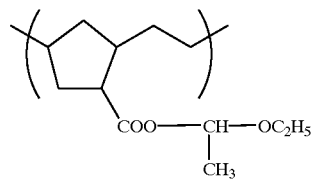

(a'6)

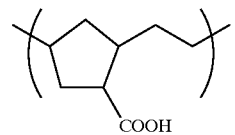

(a'7)

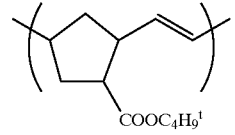

(a'8)

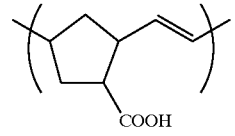

(a'9)

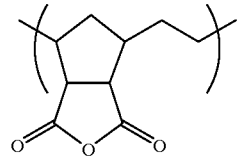

(a'10)

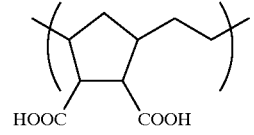

(a'11)

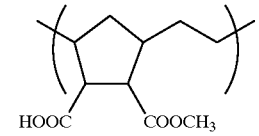

(a'12)

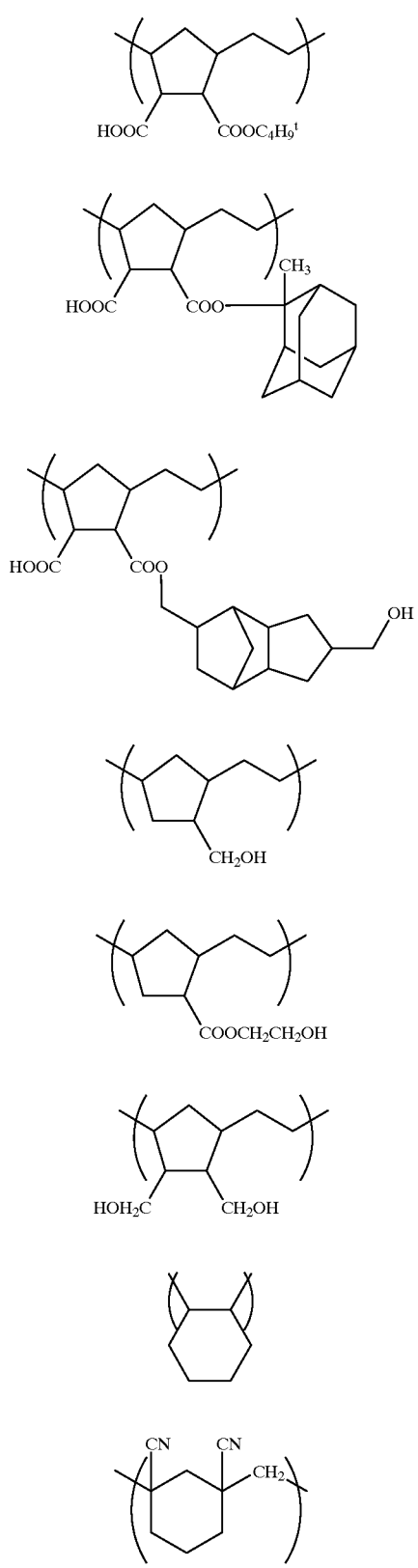
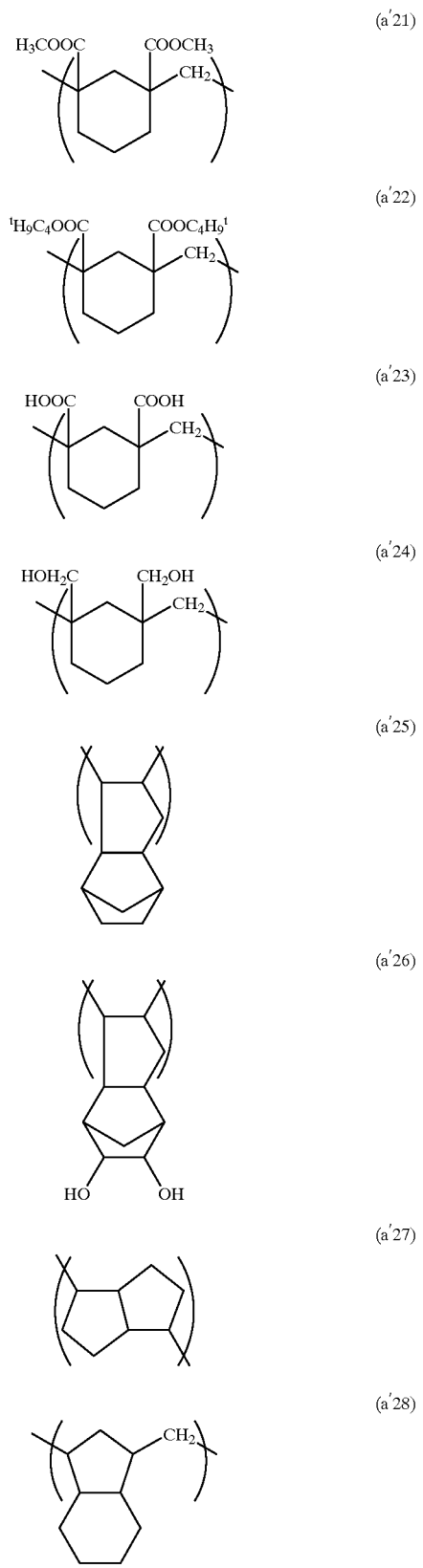

-continued
(a'29)
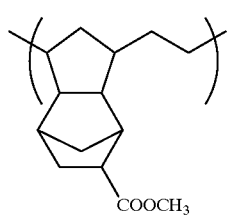
(a'30)
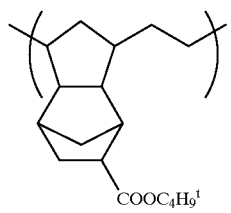
(a'31)
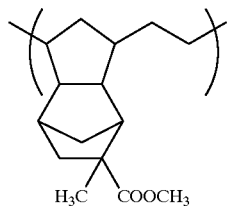
(a'32)
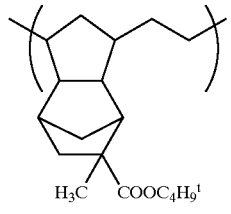
(a'33)
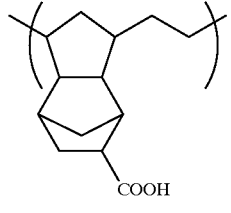
(a'34)
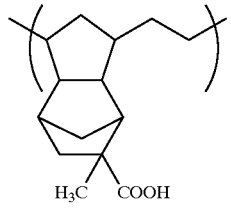
(a'35)
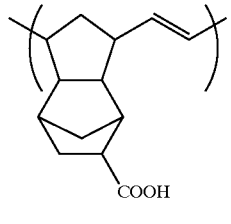
-continued
(a'36)
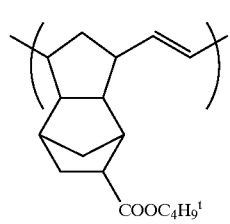
(a'37)
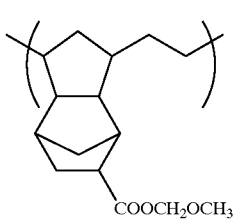
(a'38)
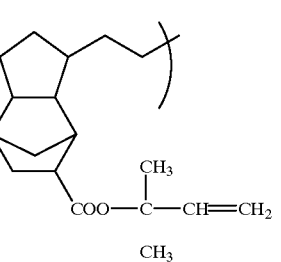
(a'39)
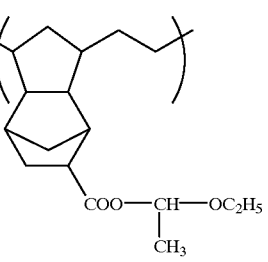
(a'40)
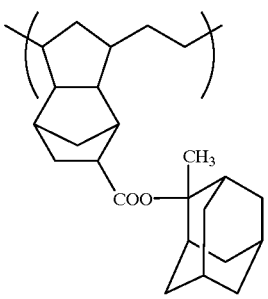
(a'41)
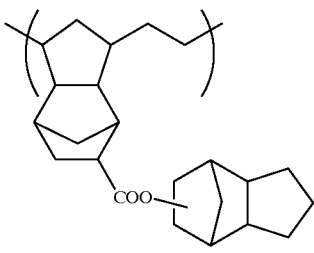

(a'42) 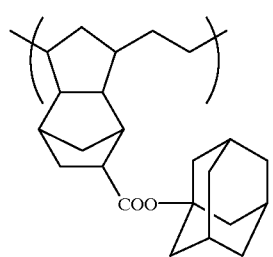
(a'43) 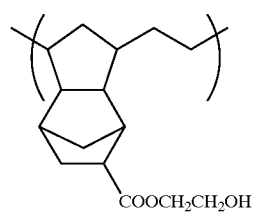
(a'44) 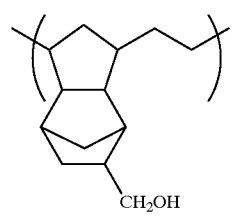
(a'45) 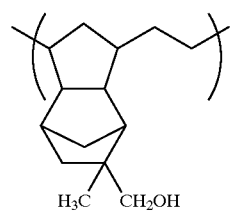
(a'46) 
(a'47) 
(a'48) 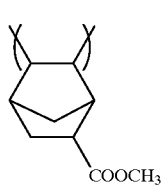
(a'49) 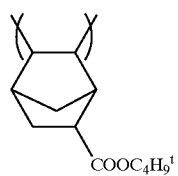
(a'50) 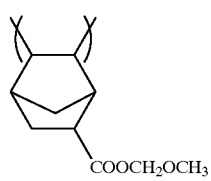
(a'51) 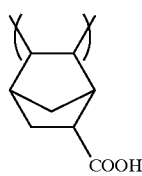
(a'52) 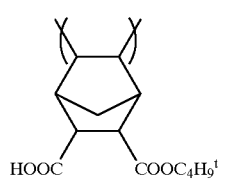
(a'53) 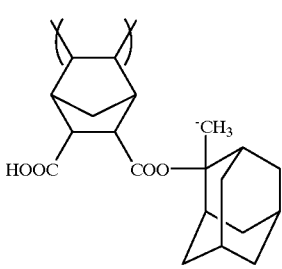
(a'54) 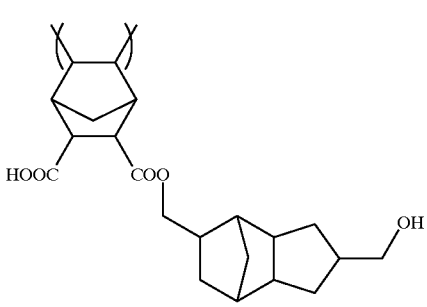
(a'55) 

(a'56)
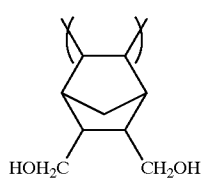
(a'57)
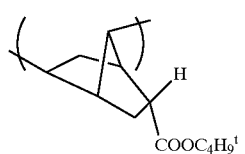
(a'58)
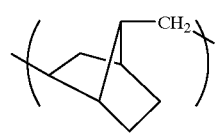
(a'59)
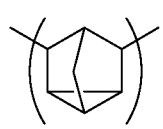
(a'60)
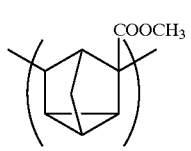
(a'61)
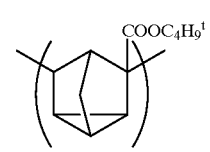
(a'62)
(a'63)
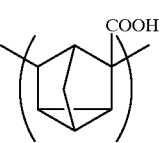
(a'64)
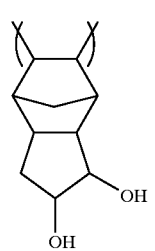
(a'65)
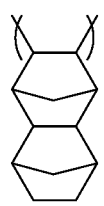
(a'66)
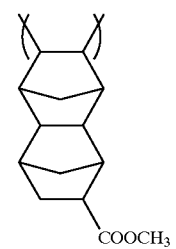
(a'67)
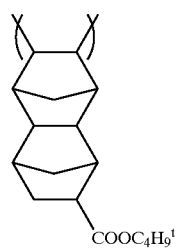
(a'68)
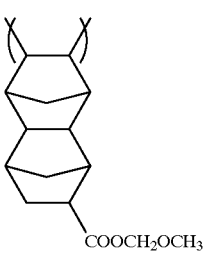
(a'69)
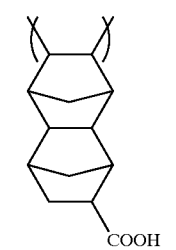
(a'70)
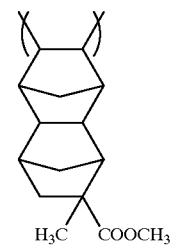

-continued
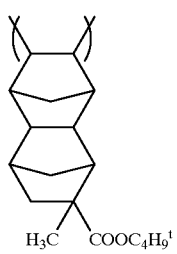
(a'71)
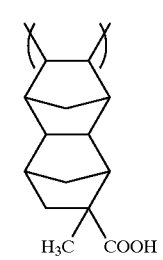
(a'72)
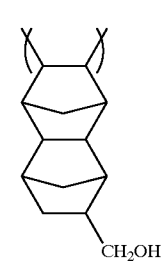
(a'73)
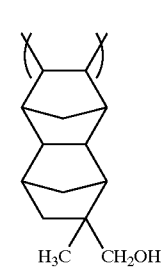
(a'74)
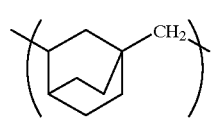
(a'75)
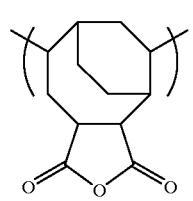
(a'76)
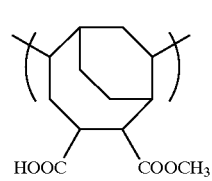
(a'77)
-continued
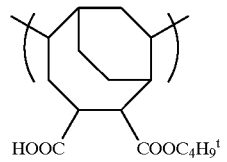
(a'78)
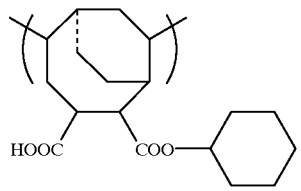
(a'79)
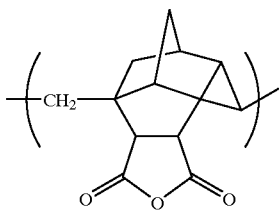
(a'80)
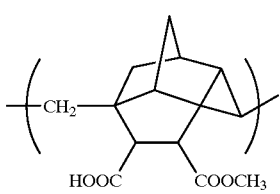
(a'81)
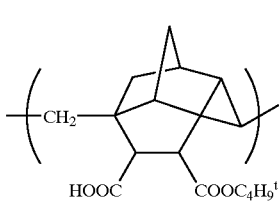
(a'82)
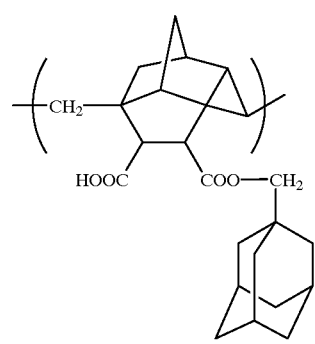
(a'83)

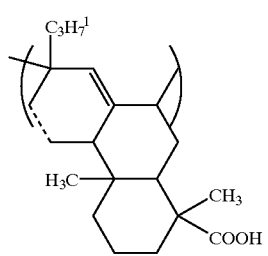
(a'84)

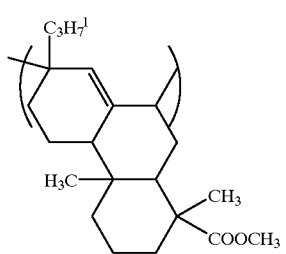
(a'85)

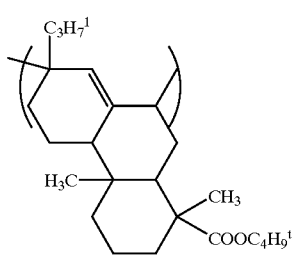
(a'86)

As described above, the resin as component (B) has a carboxyl group. The repeating unit having a carboxyl group includes the repeating units represented by formulae (IX) to (XI). The carboxyl group is contained preferably by copolymerizing the repeating unit represented by formula (IX), (X) or (XI) with the repeating unit represented by formula (IV), (V), (VI), (VII) or (VIII).

$R_{39}$, $R_{40}$ and $R_{42}$ to $R_{44}$ each represents a hydrogen atom, a halogen atom, a cyano group, an alkyl group or a haloalkyl group.

The alkyl group represented by each of $R_{39}$, $R_{40}$, $R_{42}$, $R_{43}$ or $R_{44}$ includes, for example, an alkyl group having from 1 to 4 carbon atoms and preferred specific examples thereof include a methyl group, an ethyl group, a propyl group, an n-butyl group and a sec-butyl group. The haloalkyl group includes an alkyl group having from 1 to 4 carbon atoms partially or entirely substituted by a halogen atom, and the halogen atom is preferably a fluorine atom, a chlorine atom or a bromine atom. Preferred examples of the haloalkyl group include a fluoromethyl group, a chloromethyl group, a bromomethyl group, a fluoroethyl group, a chloroethyl group and a bormoethyl group. These alkyl or haloalkyl groups each may further have or may not have a substituent.

$R_{41}$ represents a cyano group, —CO—OR$_{38}$ or —CO—NR$_{45}$R$_{46}$. $R_{38}$ in —CO—OR$_{38}$ has the same meaning as $R_{38}$ described above.

$R_{45}$ and $R_{46}$ in —CO—NR$_{45}$R$_{46}$ each represents a hydrogen atom, an alkyl group, a cycloalkyl group or an alkenyl group. The alkyl group, the cycloalkyl group and the alkenyl group each may or may not have a substituent.

The alkyl group represented by $R_{45}$ or $R_{46}$ includes, for example, an alkyl group having from 1 to 8 carbon atoms and preferred examples thereof include a methyl group, an ethyl group, a propyl group, an n-butyl group, a sec-butyl group, a hexyl group, a 2-ethylhexyl group and an octyl group. The cycloalkyl group may be either monocyclic or polycyclic. The monocyclic-type cycloalkyl group includes, for example, a cycloalkyl group having from 3 to 8 carbon atoms and preferred specific examples thereof include a cylcopropyl group, a cyclopentyl group and a cyclohexyl group. Preferred examples of the polycyclic-type cycloalkyl group include an adamantyl group, a norbornyl group, an isoboronyl group, a dicyclopentyl group, a σ-pinel group and a tricyclodecanyl group. The alkenyl group includes, for example, an alkenyl group having from 2 to 6 carbon atoms and preferred examples thereof include a vinyl group, a propenyl group, an allyl group, a butenyl group, a pentenyl group, a hexenyl group and a cyclohexenyl group. These alkyl, cycloalkyl and alkenyl groups each may or may not have a substituent.

$R_{45}$ and $R_{46}$ may be combined with each other to form a ring including the nitrogen atom. Preferred examples of the ring formed therefrom include a 5-, 6-, 7- or 8-membered ring such as pyrrolidine, piperidine and piperazine.

The alkylene group represented by $X_1$, $X_2$ or $X_3$ includes, for example, an alkylene group having from 1 to 8 carbon atoms and preferred examples thereof include a methylene group, an ethylene group, a propylene group, a butylene group, a hexylene group and an octylene group. The alkneylene group includes, for example, an alkenylene group having from 2 to 6 carbon atoms and preferred examples thereof include an ethenylene group, a propenylene group and a butenylene group. The cycloalkylene group includes, for example, a cycloalkylene group having from 5 to 8 carbon atoms and preferred examples thereof include a cyclopentylene group and a cyclohexylene group. The alkylene group, the alkenylene group and the cycloalkylene group each may or may not have a substituent.

The alkylene group, the alkenylene group and the cycloalkylene group represented by $R_{47}$, $R_{48}$ or $R_{50}$ include the same groups as the alkylene group, the alkenylene group and the cycloalkylene group, respectively, described above with respect to $X_1$ to $X_3$. The alkylene group, the alkenylene group and the cycloalkylene group may or may not contain, for example, an ether group, an ester group, an amido group, a urethane group or a ureido group, on a part of the main or side chain thereof.

$R_{49}$ in —CO—NR$_{49}$—R$_{50}$— includes the same groups as $R_{45}$ and $R_{46}$ in —CO—NR$_{45}$R$_{46}$ for $R_{41}$.

Specific examples of the repeating structural units represented by formula (IX) to (XI) are set forth below, however, the present invention is by no means limited thereto.

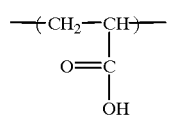
(b1)

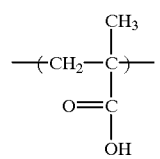
(b2)

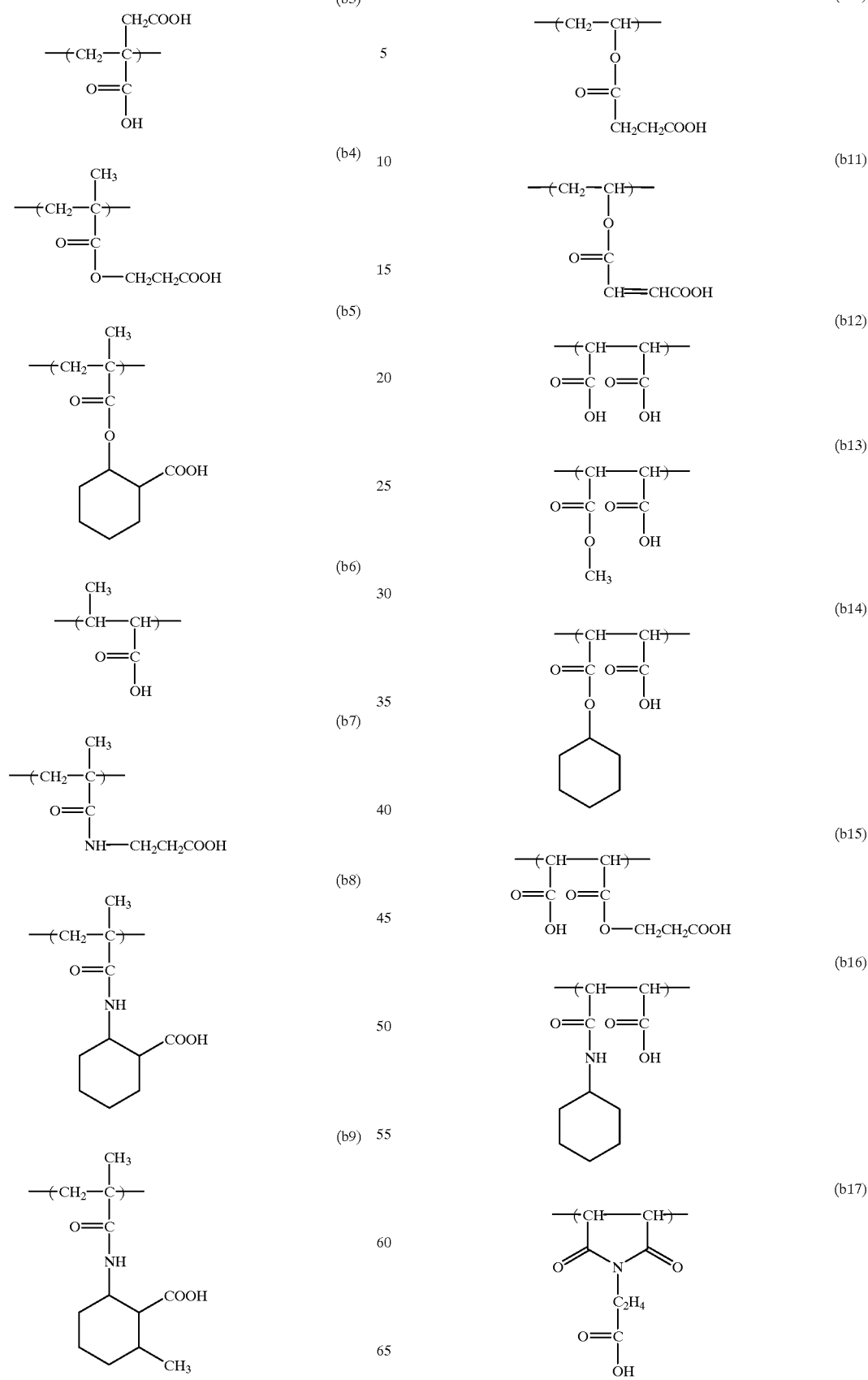

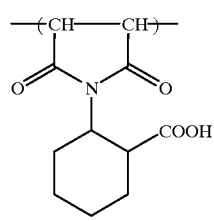
(b18)

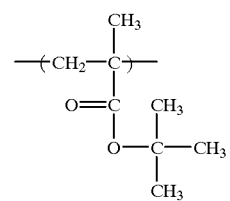
(c1)

The resin as component (B) preferably contains an acid decomposable group, more preferably an acid decomposable group represented by formula (XII) or (XIII).

In formulae (XII) and (XIII), $R_{51}$ to $R_{53}$ each represents a hydrogen atom, an alkyl group, a cycloalkyl group, an alkenyl group, an acyl group or an alkoxycarbonyl group.

The alkyl group represented by $R_{51}$, $R_{52}$, $R_{53}$ or $R_{54}$ includes, for example, an alkyl group having from 1 to 8 carbon atoms and preferred specific examples thereof include a methyl group, an ethyl group, a propyl group, an n-butyl group, a sec-butyl group, a hexyl group, a 2-ethylhexyl group and an octyl group. The cycloalkyl group includes, for example, a cycloalkyl group having from 3 to 8 carbon atoms and preferred specific examples thereof include a cyclopropyl group, a cyclopentyl group and a cyclohexyl group. The alkenyl group includes, for example, an alkenyl group having from 2 to 6 carbon atoms and preferred examples thereof include a vinyl group, a propenyl group, an allyl group, a butenyl group, a pentenyl group, a hexenyl group and a cyclohexenyl group.

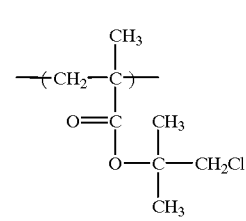
(c2)

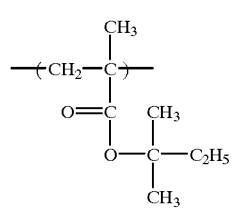
(c3)

The acyl group represented by $R_{51}$, $R_{52}$ or $R_{53}$ include, for example, an acyl group having from 1 to 10 carbon atoms and preferred specific examples thereof include a formyl group, an acetyl group, a propanoyl group, a butanoyl group and an octanoyl group. The alkoxycarbonyl group represented by $R_{51}$, $R_{52}$ or $R_{53}$ include, for example, an alkoxycarbonyl group having from 1 to 8 carbon atoms and preferred specific examples thereof include a methoxycarbonyl group, an ethoxycarbonyl group, a propoxycarbonyl group and a butoxycarbonyl group. The above-described alkyl group and other groups subsequent thereto until the alkoxycarbonyl group each may or may not have a substituent.

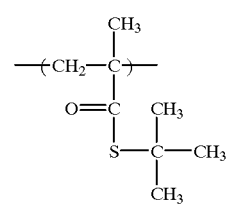
(c4)

Any two of $R_{51}$ to $R_{53}$ in formula (XII) or any two of $R_{51}$, $R_{52}$ and $R_{54}$ in formula (XIII) may be combined with each other to form a ring. Examples of the ring formed include 3- to 8-membered rings. These cyclic groups each may or may not contain a hetero atom. Preferred examples of the cyclic group include a cyclopropyl group, a cyclopentyl group, a cyclohexyl group, a cycloheptyl group, a tetrahydrofuranyl group and a tetrahydropyranyl group. These cyclic groups each may or may not have a substituent.

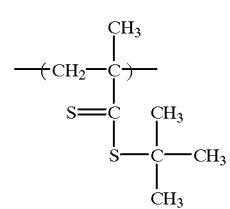
(c5)

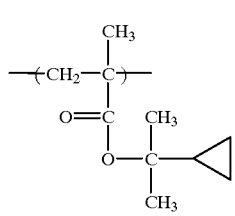
(c6)

Specific examples of the repeating structural unit having an acid decomposable group are set forth below, however, the present invention is by no means limited thereto.

-continued
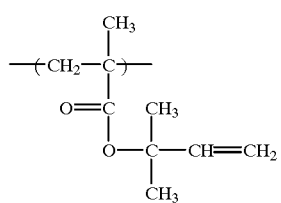 (c7)
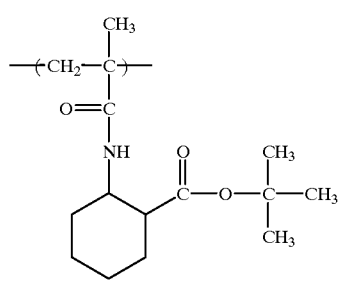 (c8)
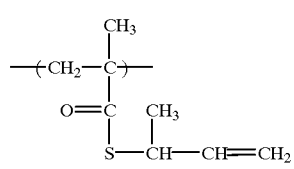 (c9)
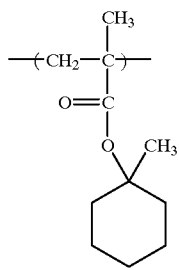 (c10)
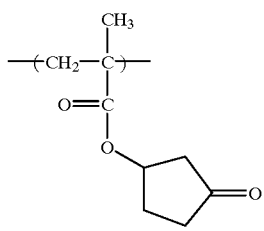 (c11)
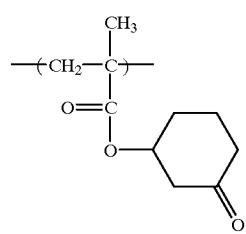 (c12)
-continued
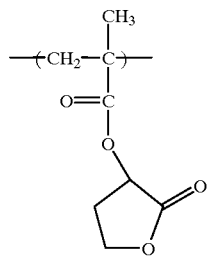 (c13)
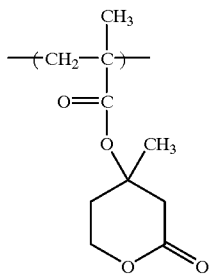 (c14)
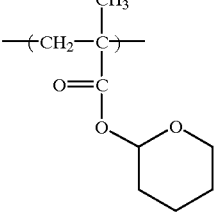 (c15)
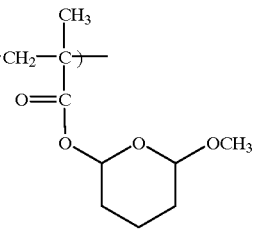 (c16)
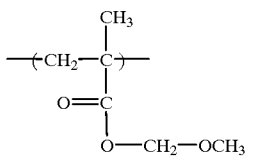 (c17)
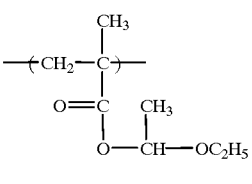 (c18)
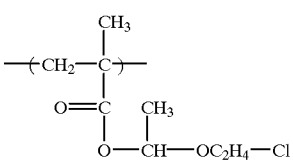 (c19)

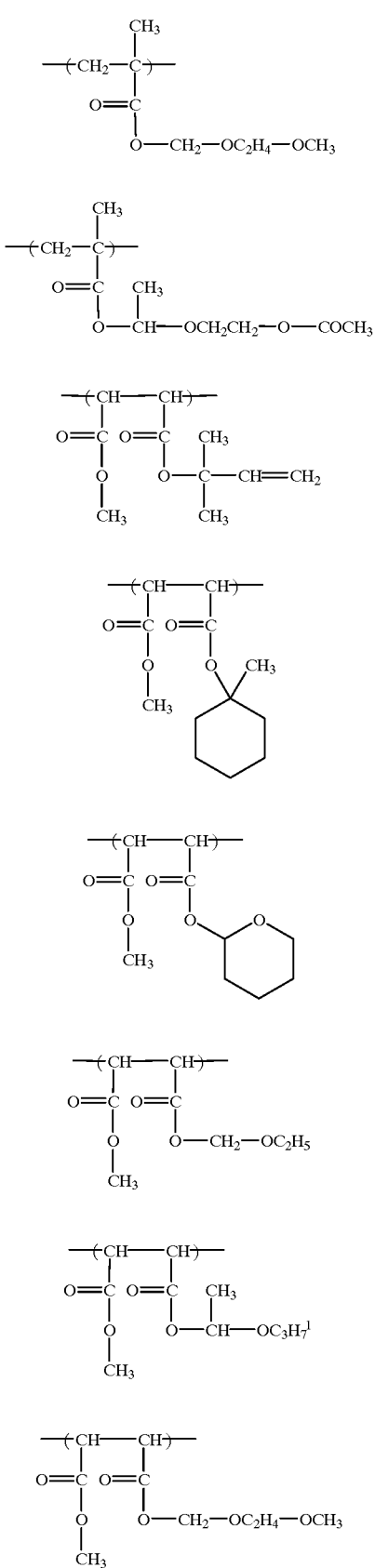

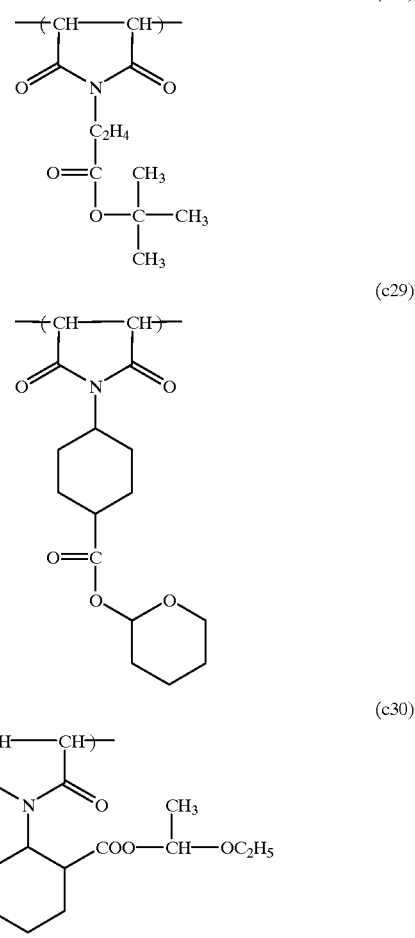

The substituent which the above-described substituent groups each may further have is described above on occasion and specific examples thereof include a hydroxyl group, a halogen atom, a nitro group, a cyano group, an amido group and a sulfonamido group. Other examples of the substituent include the alkyl groups and the alkoxy groups described for $R_8$ to $R_{47}$, the alkoxycarbonyl groups, the acyl groups and the acyloxy groups described for $R_{51}$ to $R_{53}$, and a carboxy group. Examples of the acyloxy group include an acetoxy group and a butyryloxy group, and examples of the halogen atom include fluorine, chlorine, bromine and iodine.

The content of the repeating unit having an alicyclic group on the main chain (preferably the repeating unit represented by formula (II) or (III)), preferably the repeating unit represented by formula (IV), (V), (VI), (VII) or (VIII), is usually 30 mol % or more, preferably from 40 to 100 mol %, more preferably from 50 to 100 mol %, and still more preferably from 70 to 100 mol %, however, it is preferably adjusted in practice taking account of the balance with the resistance against dry etching and the alkali developability.

The resin as component (B) has a carboxyl group. The content of the repeating structural unit having a carboxyl group in the resin is preferably from 10 to 70 mol %, more preferably from 20 to 60 mol %, still more preferably from 30 to 50 mol %, based on all repeating structural units. This content is preferably adjusted taking account of the content of the compound as component (C) and further, the capabilities such as alkali developability, adhesion to substrate and sensitivity. The content of the repeating structural unit having a carboxyl group in the resin referred to above is the content of all structural units in the resin, including those contained in the repeating unit having an alicyclic group on the main chain.

The content of the repeating structural unit having an acid decomposable group in the resin is preferably from 0 to 70 mol %, more preferably from 10 to 60 mol %, still more preferably from 20 to 50 mol %, based on all repeating structural units. This content is preferably adjusted taking account of the capabilities such as alkali developability, adhesion to substrate and sensitivity. The content of the repeating structural unit having an acid decomposable group in the resin referred to above is the content of all structural units in the resin, including those contained in the repeating unit having an alicyclic group on the main chain.

For the purpose of improving capabilities of the resin as component (B), another polymerizable monomer may further be copolymerized within the range of not extremely impairing transmissibility at 220 nm or less and dry etching resistant property of the resin.

Examples of the copolymerizable monomer which can be used include compounds having one addition-polymerizable unsaturated bond, selected from acrylic acid esters, acrylamides, methacrylic acid esters, methacrylamides, allyl compounds, vinyl ethers, vinyl esters, styrenes and crotonic acid esters.

Specific examples thereof include acrylic acid esters such as alkyl (the alkyl group preferably has from 1 to 10 carbon atoms) acrylate (e.g., methyl acrylate, ethyl acrylate, propyl acrylate, t-butyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, atumethoxybenzyl acrylate, furfuryl acrylate, tetrahydrofurfuryl acrylate) and aryl acrylate (e.g., phenyl acrylate, hydroxyphenyl acrylate); methacrylic acid esters such as alkyl (the alkyl group preferably has from 1 to 10 carbon atoms) methacrylate (e.g., methyl methacrylate, ethyl methacrylate, propyl methacrylate, isopropyl methacrylate, t-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfuryl methacrylate) and aryl methacrylate (e.g., phenyl methacrylate, hydroxyphenyl methacrylate, cresyl methacrylate, naphthyl methacrylate); acrylamides such as acrylamide, N-alkylacrylamide (the alkyl group is an alkyl group having from 1 to 10 carbon atoms, for example, methyl group, ethyl group, propyl group, butyl group, t-butyl group, heptyl group, octyl group, cyclohexyl group, benzyl group, hydroxyethyl group or benzyl group), N-arylacrylamide (the aryl group is, for example, phenyl group, tolyl group, nitrophenyl group, naphthyl group, cyanophenyl group, hydroxyphenyl group or carboxyphenyl group), N,N-dialkylacrylamide (the alkyl group is an alkyl group having from 1 to 10 carbon atoms, for example, methyl group, ethyl group, butyl group, isobutyl group, ethylhexyl group or cyclohexyl group), N,N-arylacrylamide (the aryl group is, for example, phenyl group), N-methyl-N-phenylacrylamide, N-hydroxyethyl-N-methylacrylamide and N-2-acetamidoethyl-N-acetylacrylamide; methacrylamides such as methacrylamide, N-alkylmethacrylamide (the alkyl group is an alkyl group having from 1 to 10 carbon atoms, for example, methyl group, ethyl group, t-butyl group, ethylhexyl group, hydroxyethyl group or cyclohexyl group), N-arylmethacrylamide (the aryl group is, for example, phenyl group, hydroxyphenyl group or carboxyphenyl group), N,N-dialkylmethacrylamide (the alkyl group is, for example, ethyl group, propyl group or butyl group), N,N-diarylmethacrylamide (the aryl group is, for example, phenyl group), N-hydroxyethyl-N-methylmethacrylamide, N-methyl-N-phenylmethacrylamide and N-ethyl-N-phenylmethacrylamide; allyl compounds such as allyl esters (e.g., allyl acetate, allyl caproate, allyl caprylate, allyl laurate, allyl palmitate, allyl stearate, allyl benzoate, allyl acetoacetate, allyl lactate) and allyloxyethanol; vinyl ethers such as alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether) and vinyl aryl ether (e.g., vinyl phenyl ether, vinyl tolyl ether, vinyl chlorophenyl ether, vinyl-2,4-dichlorophenyl ether, vinyl naphthyl ether, vinyl anthranyl ether); vinyl esters such as vinyl butyrate, vinyl isobutyrate, vinyl trimethyl acetate, vinyl diethyl acetate, vinyl valerate, vinyl caproate, vinyl chloroacetate, vinyl dichloroacetate, vinyl methoxy acetate, vinyl butoxy acetate, vinyl phenyl acetate,-vinyl acetoacetate, vinyl lactate, vinyl-β-phenyl butyrate, vinylcyclohexyl carboxylate, vinyl benzoate, vinyl salicylate, vinyl chlorobenzoate, vinyl tetrachlorobenzoate and vinyl naphthoate; styrenes such as styrene, alkylstyrene (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, acetoxymethylstyrene), alkoxystyrene (e.g., methoxystyrene, 4-methoxy-3-methylstyrene, dimethoxystyrene), halogen styrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene), hydroxystyrene (e.g., 4-hydroxystyrene, 3-hydroxystyrene, 2-hydroxystyrene, 4-hydroxy-3-methylstyrene, 4-hydroxy-3,5-dimethylstyrene, 4-hydroxy-3-methoxystyrene, 4-hydroxy-3-(2-hydroxybenzyl)styrene) and carboxystyrene; crotonic acid esters such as alkyl crotonate (e.g., butyl crotonate, hexyl crotonate, glycerin monocrotonate); dialkyl itaconates (e.g., dimethyl itaconate, diethyl itaconate, dibutyl itaconate); dialkyl esters of a maleic acid or fumaric acid (e.g., dimethyl maleate, dibutyl fumarate), maleic anhydride, maleimide, acrylonitrile, meth-acrylonitrile and maleylonitrile. In addition, addition-polymerizable unsaturated compounds which can be copolymerized in general may be used.

Among these, monomers capable of increasing the alkali solubility are preferred as the copolymer component, for example, monomers having a carboxyl group, such as carboxystyrene, N-(carboxyphenyl)acrylamide and N-(carboxyphenyl)methacrylamide, monomers having a phenolic hydroxyl group, such as hydroxystyrene, N-(hydroxyphenyl)-acrylamide, N-(hydroxyphenyl)

methacrylamide, hydroxyphenyl acrylate and hydrophenyl methacrylate, and maleimide are preferred.

The resin for use in the present invention preferably has a hydroxyl group. The hydroxyl group may be contained in X the repeating unit represented by formula (II) or (III) (preferably formula (IV), (V), (VI), (VII) or (VIII)) or may be contained in a different repeating structural unit. The content of the repeating unit having a hydroxyl group in the resin (B) for use in the present invention is, including those contained in the repeating unit represented by formula (II) or (III) (preferably formula (IV), (V), (VI), (VII) or (VIII)), preferably from 0 to 60 mol %, more preferably from 10 to 40 mol %. Due to this hydroxyl group, the adhesion between the substrate and the resist film is improved.

The content of the other polymerizable monomer in the resin as component (B) is preferably 50 mol % or less, more preferably 30 mol % or less, based on all repeating units.

The resin as component (B) has a molecular weight, in terms of the weight average (Mw: polystyrene basis), of 2,000 or more, preferably from 3,000 to 1,000,000, more preferably from 5,000 to 200,000, still more preferably from 20,000 to 100,000. As the molecular weight is larger, the heat resistance is more improved, however, the developability deteriorates, therefore, a preferred molecular weight is selected taking account of the balance therebetween. The degree of dispersion (Mw/Mn) is preferably from 1.0 to 5.0, more preferably from 1.0 to 3.0. As the degree of dispersion is smaller, the heat resistance and the image performance (pattern profile, defocus latitude, etc.) are improved.

In the present invention, the amount of the resin added in the positive resist composition is from 50 to 99.7 wt %, preferably from 70 to 99 wt %, based on all solid contents.

The resin as component (B) is synthesized by the radical, cation or anion polymerization of unsaturated monomers corresponding to respective structures.

More specifically, respective monomers are mixed based on the preferred composition described above and polymerized in an appropriate solvent by adding a polymerization catalyst in a monomer concentration of from about 10 to 40 wt %, if desired, under heating. Examples of the method include the following representative three methods:

(1) ring-opening metathesis polymerization of a monocyclic or polycyclic cyclo-olefin using a coordination polymerization catalyst such as a transition metal complex;

(2) addition polymerization of a monocyclic or polycyclic cyclo-olefin using an electrophilic transition metal catalyst; and (3) free radical-type copolymerization of a monocyclic or polycyclic cyclo-olefin with an electrophilic olefin (e.g., maleic acid).

Specific examples of the synthesis method are described in K. J. Ivn, *Olefin Metathesis,* Academic Press (1983), V. Draguton et al., *Olefin Metathesis and Ring-Opening Polymerization of Cyclo-Olefins,* Wiley-Interscience (1985), S. Matsumoto et al., *ACS Symposium Series,* No. 59, 303 (1977), *J. Am. Chem.,* 110, 960 (1988), *J. Am. Chem.,* 112, 8378 (1990), *J. Am. Chem.,* 113, 6899 (1991), *J. Organomet. Chem.,* 358, 567 (1988), *Makromol. Chem.,* 193, 2917 (1992), *J. Mol. Cat.,* 74, 109 (1992), *Polym. Bull.,* 31, 175 (1993), *J. Macromol. Sci. Chem.,* A5, 1339 (1971), *J. Photopolym. Sci. Tech.,* 7, 141 (1994) and the like.

In addition, the methods described in *J. Am. Chem.,* 79 5771 (1957), *J. Am. Chem.,* 81, 984 (1959); *Makromol. Chem.,* 134, 147 (1970), *J. Org. Chem.,* 26, 4658 (1961), *J. Polym. Sci.,* 61, 538 (1962), *J. Polym. Sci., Part A*3, 723 (1965), *J. Polym. Sci. Part A*3, 1609 (1965), British Patent 1,255,838, JP-B-48-20632 (the term "JP-B" as used herein means an "examined Japanese patent publication"), JP-B-48-43191, JP-B-55-5525, JP-B-57-16130, JP-B-58-50270, JP-B-58-50272, JP-B-2-9619, JP-B-2-42094, JP-B-6-18817, JP-A-51-6300, JP-A-51-31800, JP-A-53-71200, JP-A-1-197460, JP-A-1-217453, JP-A-1-318023, JP-A-1-318025, JP-A-2-146045, JP-A-2-59751, JP-A-4-63810, JP-A-4-249509, JP-A-4-353507, JP-A-5-80515 and JP-A-5-297591 may be used.

[2] Compound as Component (C)

The compound as component (C) is a compound having at least two groups represented by formula (I).

In formula (I), the alkyl group represented by $R_1$, $R_2$ or $R_3$ is preferably an alkyl group having from 1 to 8 carbon atoms, which may have a substituent, such as methyl group, ethyl group, propyl group, n-butyl group, sec-butyl group, hexyl group, 2-ethylhexyl group or octyl group. The cycloalkyl group is preferably a cycloalkyl group having from 3 to 8 carbon atoms, such as cyclopropyl group, cyclopentyl group or cyclohexyl group. Any two of $R_1$ to $R_3$ may be combined to form a ring. Preferred examples of the ring include 3- to 8-membered rings which may contain a hetero atom, such as cyclopropyl group, cyclopentyl group, cyclohexyl group, cycloheptyl group, dihydrofuranyl group and dihydropyranyl group. The ring may further have a substituent.

Preferred examples of the substituent for the above-described substituent groups and rings include a hydroxyl group, a halogen atom (e.g., fluorine, chlorine, bromine, iodine), a nitro group, a cyano group, an amido group, a sulfonamido group, the alkyl groups described above with respect to $R_1$ to $R_3$, an alkoxy group having from 1 to 8 carbon atoms such as methoxy group, ethoxy group, hydroxyethoxy group, propoxy group, hydroxypropoxy group and butoxy group, an alkoxycarbonyl group such as methoxycarbonyl group and ethoxycarbonyl group, an acyl group such as formyl group and acetyl group, and an acyloxy group such as acetoxy group and butyryloxy group.

Examples of the compound having at least two groups represented by formula (I) such as enol ether group and enol thioether group include the compounds where two or more groups represented by formula (I) such as enol ether group and enol thioether group are connected by a divalent or greater valent linking group.

Examples of the linking structure (linking group) include a polyvalent group formed by a polyvalent alkylene group, a polyvalent cycloalkylene group or a combination of two or more thereof, which may-have a substituent and may contain a hetero atom. The linking group may further form a divalent linking group together with an ether group, an ester group, an amido group, a urethane group or a ureido group.

The number (m) of the groups represented by formula (I) contained in the compound having at least two enol ether groups represented by formula (I) is preferably from 2 to 8, more preferably from 2 to 5.

The compound having at least two enol ether groups represented by formula (I) is preferably a compound represented by formula (XIV).

In formula (XIV), the alkylene group is preferably an m-valent alkylene group having from 1 to 8 carbon atoms, such as ethylene group, propylene group, butylene group or hexylene group. The cycloalkylene group is preferably a monocyclo, bicyclo or tricyclo m-valent cycloalkylene group having from 5 to 20 carbon atoms, such as cyclopentylene group, cyclohexylene group, cyclo-octylene group, adamantylene group or tricyclodecanylene group. Examples of the hetero atom include an oxygen atom, a sulfur atom and a nitrogen atom.

Preferred examples of the substituent for the linking group include a hydroxyl group; a halogen atom (e.g., fluorine, chlorine, bromine, iodine), a nitro group, a cyano group, an amido group, a sulfonamido group, the alkyl groups described above with respect to $R_1$ to $R_3$, an alkoxy group having from 1 to 8 carbon atoms such as methoxy group, ethoxy group, hydroxyethoxy group, propoxy group, hydroxypropoxy group and butoxy group, an alkoxycarbonyl group such as methoxycarbonyl group and ethoxycarbonyl group, an acyl group such as formyl group and acetyl group, and an acyloxy group such as acetoxy group and butyryloxy group.

Among these, those having an m-valent cycloalkylene group are preferred because resistance against dry etching is imparted.

In the present invention, the content of the compound as component (C) in the composition is adjusted in accordance with the carboxyl group (and hydroxy group) in the resin as component (B) taking account of the capabilities such as alkali developability, adhesion to substrate and sensitivity. The content is preferably from 3 to 60 wt %, more preferably from 5 to 50 wt %, still more preferably from 10 to 40 wt %, based on all solid contents in the composition.

Specific examples of the compound as component (C) are set forth below, however, the present invention is by no means limited thereto.

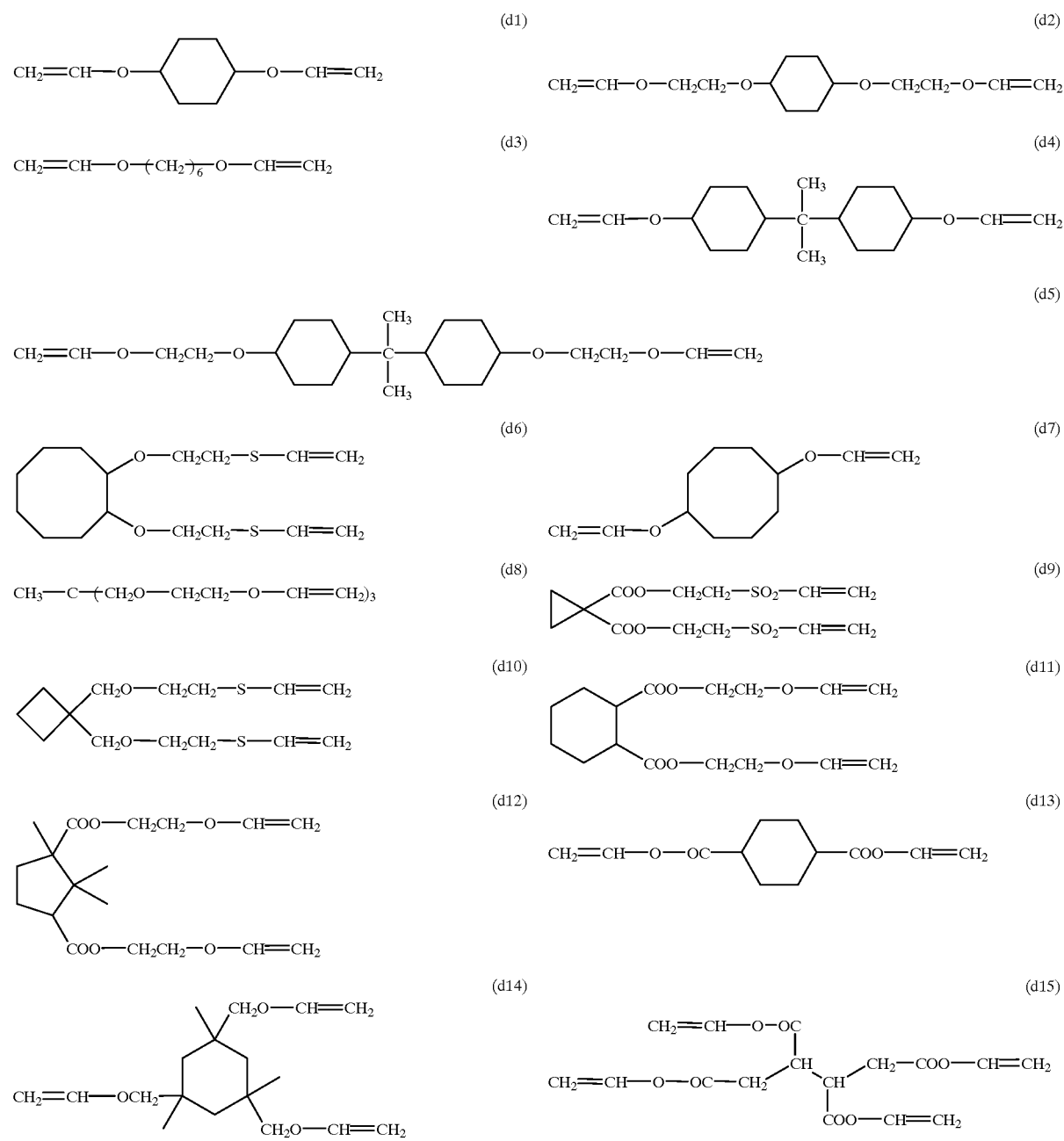

(d16)
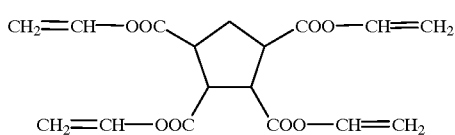
(d17)
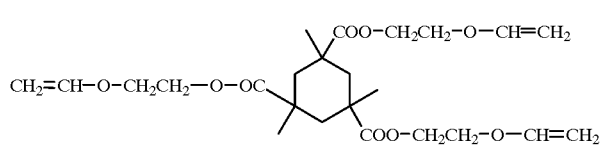
(d18)
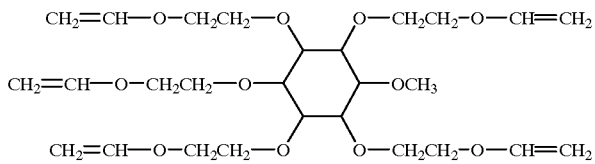
(d19)
(d20)
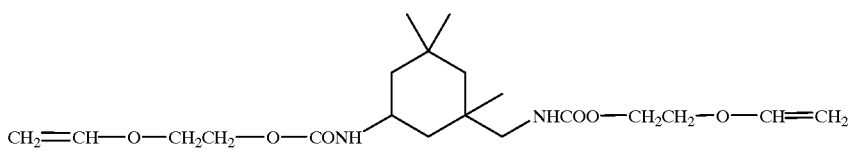
(d21)
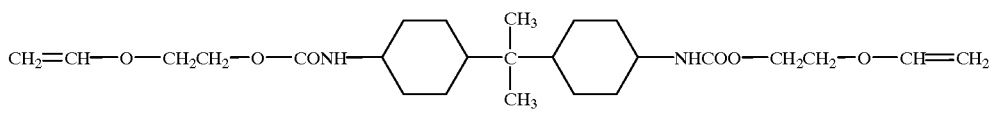
(d22)
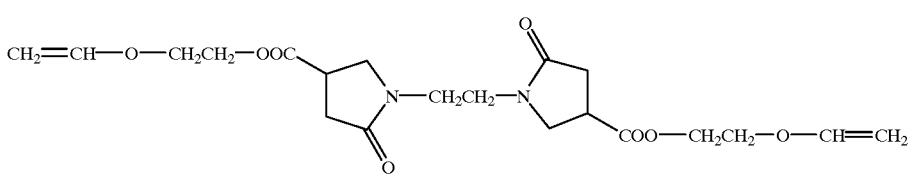
(d23)
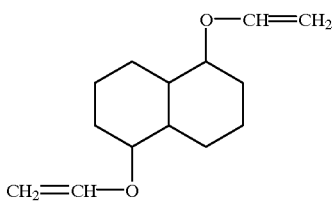
(d24)
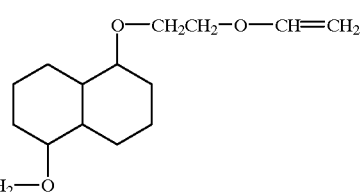
(d25)
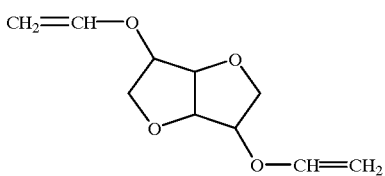
(d26)
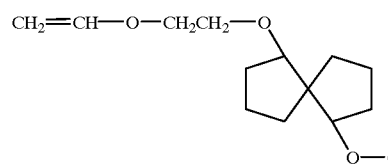
(d27)
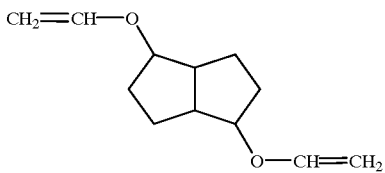
(d28)
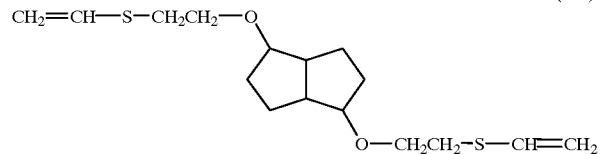

-continued
(d29) 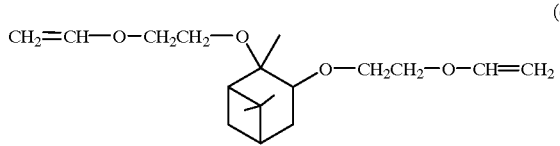
(d30) 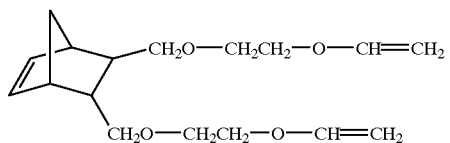
(d31) 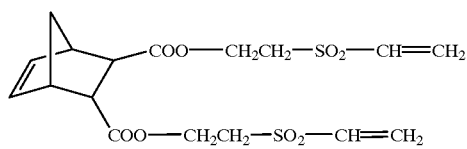
(d32) 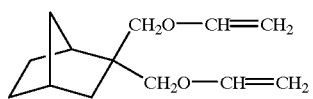
(d33) 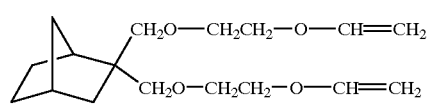
(d34) 
(d35) 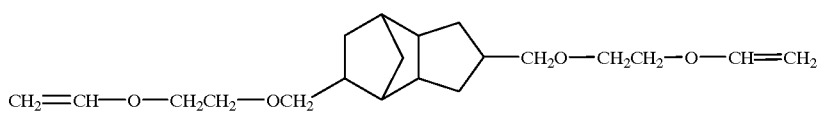
(d36) 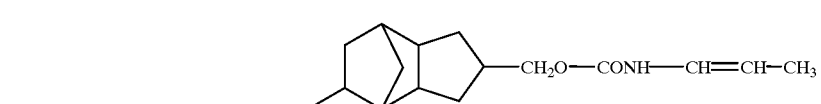
(d37) 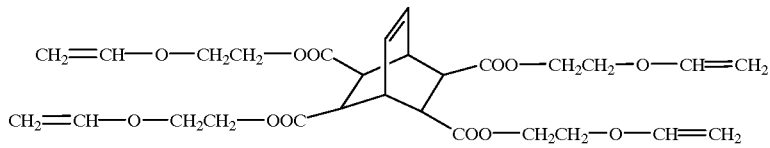
(d38) 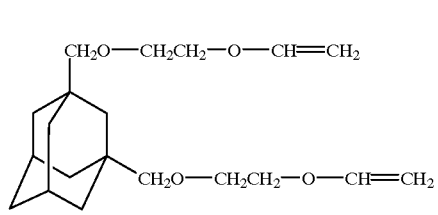
(d39) 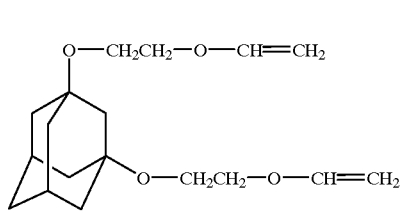
(d40) 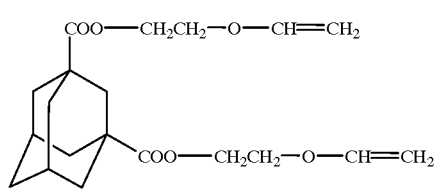
(d41) 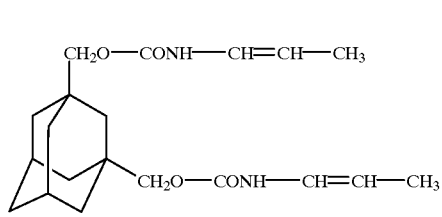
(d42) 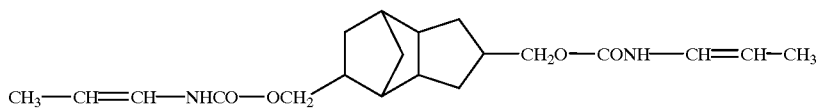
(d43) 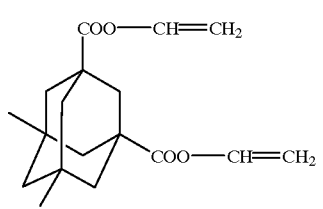

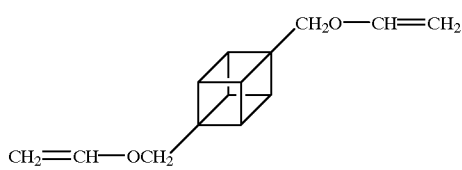 (d44)

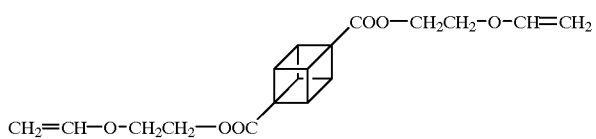 (d45)

[3] Compound as Component (A)

The compound as component (A) for use in the present invention is a photo acid generator which is a compound of generating an acid on irradiation of an active light ray or radiation.

The compound which decomposes on irradiation of an active light ray or radiation and generates an acid, for use in the present invention, may be appropriately selected from photoinitiators for photo-cation polymerization, photoinitiators for photo-radical polymerization, photo-achromatizing agents, photo-discoloring agents, known compounds used in a microresist or the like, which generate an acid by light (ultraviolet ray or far ultraviolet ray of from 200 to 400 nm, particularly preferably, g-line, h-line, i-line, KrF excimer laser beam), an ArF excimer laser beam, an electron beam, an X ray, a molecular beam or an ion beam, and a mixture of these compounds.

Other examples of the compound generating an acid on irradiation of an active light ray or radiation for use in the present invention include diazonium salts described in S. I. Schlesinger, Photogr. Sci. Eng., 18, 387 (1974) and T. S. Bal et al., Polymer, 21, 423 (1980), ammonium salts described in U.S. Pat. Nos. 4,069,055, 4,069,056 and Re 27,992 and JP-A-3-140140, phosphonium salts described in D. C. Necker et al., Macromolecules, 17, 2468 (1984), C. S. Wen et al., Teh. Proc. Conf. Rad. Curing ASIA, p. 478, Tokyo, Oct. (1988) and U.S. Pat. Nos. 4,069,055 and 4,069,056, iodonium salts described in J. V. Crivello et al., Macromolecules, 10(6), 1307 (1977), Chem. & Eng. News. Nov. 28, p. 31 (1988), European Patents 104143, 339049 and 410201, JP-A-2-150848 and JP-A-2-296514, sulfonium salts described in J. V. Crivello et al., Polymer J. 17, 73 (1985), J. V. Crivello et al., J. Org. Chem., 43, 3055 (1978), W. R. Watt et al., J. Polymer Sci. Polymer Chem. Ed., 22, 1789 (1984), J. V. Crivello et al., Polymer Bull., 14, 279 (1985), J. V. Crivello et al., Macromolecules, 14(5), 1141 (1981), J. V. Crivello et al., J. Polymer Sci. Polymer Chem. Ed., 17, 2877 (1979), European Patents 161811, 410201, 339049, 370693, 233567, 297443 and 297442, U.S. Pat. Nos. 3,902,114, 4,933,377, 4,760,013, 4,734,444 and 2,833,827, German Patents 2,904,626, 3,604,580 and 3,604,581, JP-A-7-28237 and JP-A-8-27102, selenium salts described in J. V. Crivello et al., Macromolecules, 10(6), 1307 (1977), and J. V. Crivello et al., J. Polymer Sci. Polymer Chem. Ed., 17, 1047 (1979), onium salts such as arsonium salt described in C. S. Wen et al., Teh, Proc. Conf. Rad. Curing ASIA, p. 478, Tokyo, Oct. (1988), organic halogen compounds described in U.S. Pat. No. 3,905,815, JP-B-46-4605, JP-A-48-36281, JP-A-55-32070, JP-A-60-239736, JP-A-61-169835- JP-A-61-169837, JP-A-62-58241, JP-A-62-212401, JP-A-63-70243 and JP-A-63-298339, organic metals/organic halides described in K. Meier et al., J. Rad. Curing, 13(4), 26 (198–6), T. P. Gill et al., Inorg. Chem., 19, 3007 (1980), D. Astruc, Acc. Chem. Res., 19(12), 377 (1896) and JP-A-2-161445, photo acid generators having an o-nitrobenzyl type protective group, described in S. Hayase et al., J. Polymer Sci., 25, 753 (1987), E. Reichmanis et al., J. Polymer Sci., Polymer Chem. Ed., 23, 1 (1985), Q. Q. Zhu et al., J. Photochem., 36, 85, 39, 317 (1987), B. Amit et al., Tetrahedron Lett., (24)2205 (1973), D. H. R. Barton et al., J. Chem. Soc., 3571 (1965), P. M. Collins et al., J. Chem. Soc., Perkin I, 1695 (1975), M. Rudinstein et al., Tetrahedron Lett., (17), 1445 (1975), J. W. Walker et al., J. Am. Chem. Soc., 110, 7170 (1988), S. C. Busman et al., J. Imaging Technol., 11(4), 191 (1985), H. M. Houlihan et al., Macromolecules, 21, 2001 (1988), P. M. Collins et al., J. Chem. Soc. Chem. Commun., 532 (1972), S. Hayase et al., Macromolecules, 18, 1799 (1985), E. Reichmanis et al., J. Electrochem. Soc. Solid State Sci. Technol., 130(6), F. M. Houlihan et al., Macromolecules, 21, 2001 (1988), European Patents 0290750, 046083, 156535, 271851 and 0388343, U.S. Pat. Nos. 3,901,710 and 4,181,531, JP-A-60-198538 and JP-A-53-133022, compounds which photolyze and generate a sulfonic acid, represented by iminosulfonate and the like and described in M. TUNOOKA et al., Polymer Preprints Japan, 35(8), G. Berner et al., J. Rad. Curing, 13(4), W. J. Mijs et al., Coating Technol., 55(697), 45 (1983), Akzo, H. Adachi et al., Polymer Preprints, Japan, 37(3), European Patents 0199672, 84515, 044115, 618564 and 0101122, U.S. Pat. Nos. 4,371,605 and 4,431,774, JP-A-64-18143, JP-A-2-245756 and JP-A-3-140109, disulfone compounds described in JP-A-61-166544 and JP-A-2-71270, and diazoketosulfone and diazodisulfone compounds described in JP-A-3-103854, JP-A-3-103856 and JP-A-4-210960.

Furthermore, compounds having introduced into the main or side chain of the polymer the group or compound generating an acid by light may also be used and examples thereof include compounds described in M. E. Woodhouse et al., J. Am. Chem. Soc., 104, 5586 (1982), S. P. Pappas et al., J. Imaging Sci., 30(5), 218 (1986), S. Kondo et al., Makromol. Chem., Rapid Commun., 9, 625 (1988), Y. Yamada et al., Makromol. Chem., 152, 153, 163 (1972), J. V. Crivello et al., J. Polymer Sci., Polymer Chem. Ed., 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029.

Also, compounds which generate an acid by light described in V. N. R. Pillai, Synthesis, (1), 1 (1980), A. Abad et al., Tetrahedron Lett., (47) 4555 (1971), D. H. R. Barton et al., J. Chem. Soc., (C), 329 (1970), U.S. Pat. No. 3,779,778 and European Patent 126712 may be used.

Among the above-described compounds which decompose on irradiation of an active light ray or radiation and generate an acid, those which can be particularly effectively used are described below.

(1) Oxazole Derivative represented by Formula (PAG1) or S-Triazine Derivative represented by Formula (PAG2), substituted by Trihalomethyl Group

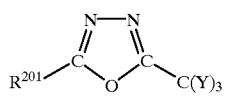 (PAG1)

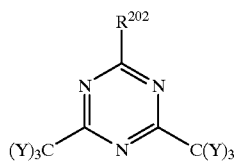 (PAG2)

wherein $R^{201}$ represents a substituted or unsubstituted aryl group or alkenyl group, $R^{202}$ represents a substituted or unsubstituted aryl group, alkenyl group or alkyl group or —C(Y)$_3$, and Y represents a chlorine atom or a bromine atom.

Specific examples thereof include the following compounds, however, the present invention is by no means limited thereto.

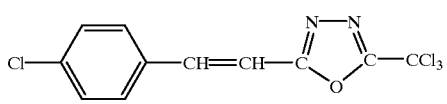 (PAG1-1)

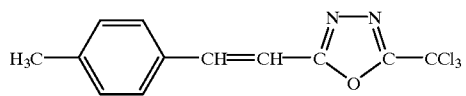 (PAG1-2)

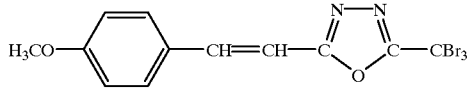 (PAG1-3)

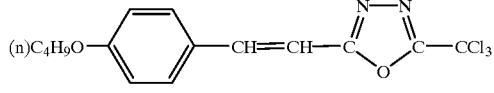 (PAG1-4)

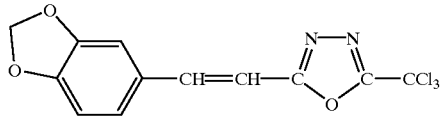 (PAG1-5)

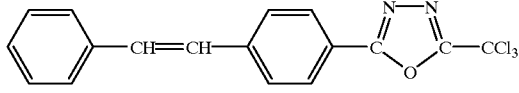 (PAG1-6)

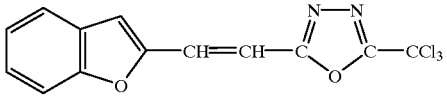 (PAG1-7)

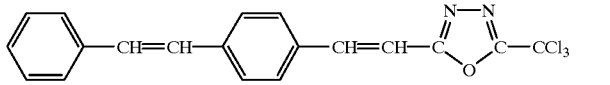 (PAG1-8)

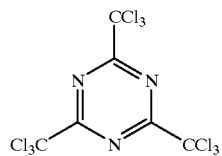 (PAG2-1)

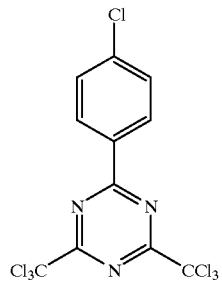 (PAG2-2)

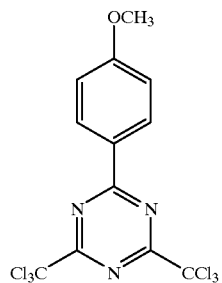 (PAG2-3)

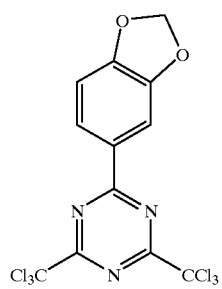 (PAG2-4)

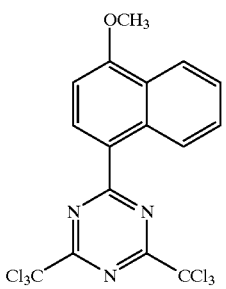 (PAG2-5)

(PAG2-6)
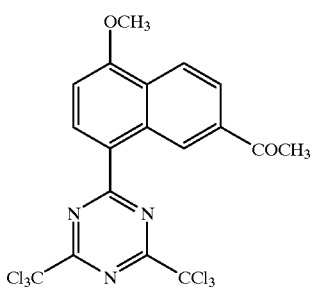

(PAG2-7)
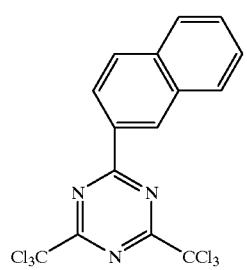

(PAG2-8)
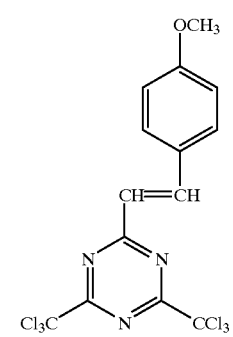

(PAG2-9)
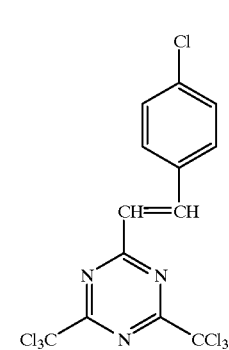

(PAG2-10)

(2) Iodonium Salt represented by Formula (PAG3) or Sulfonium Salt represented by Formula (PAG4)

(PAG3)

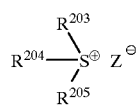
(PAG4)

In the formulae, $Ar^1$ and $Ar^2$ each independently represents a substituted or unsubstituted aryl group. Preferred examples of the substituent include an alkyl group, a haloalkyl group, a cycloalkyl group, an aryl group, an alkoxy group, a nitro group, a carboxyl group, an alkoxycarbonyl group, a hydroxy group, a mercapto group and a halogen atom.

$R^{203}$, $R^{204}$ and $R^{205}$ each independently represents a substituted or unsubstituted alkyl group or aryl group, preferably an aryl group having from 6 to 14 carbon atoms, an alkyl group having from 1 to 8 carbon atoms, or a substituted derivative thereof. Preferred examples of the substituent include, for the aryl group, an alkoxy group having from 1 to 8 carbon atoms, an alkyl group having from 1 to 8 carbon atoms, a nitro group, a carboxyl group, a hydroxyl group and a halogen atom, and for the alkyl group, an alkoxy group having from 1 to 8 carbon atoms, a carboxyl group and an alkoxycarbonyl group.

Examples of the counter anion represented by $Z^-$ include perfluoroalkane sulfonate anions such as $BF_4^-$, $AsF_6^-$, $PF_6^-$, $SbF_6^-$, $SiF_6^{2-}$, $ClO_4^-$ and $CF_3SO_3^-$, pentafluorobenzene sulfonate anions, condensed polynuclear aromatic sulfonate anions such as naphthalene-1-sulfonate anion, anthraquinone sulfonate anion, and sulfonic acid group-containing dyes, however, the present invention is by no means limited thereto.

Two of $R^{203}$, $R^{204}$ and $R^{205}$ or $Ar^1$ and $Ar^2$ may be combined through a single bond or a substituent.

Specific examples include the following compounds, however, the present invention is not limited thereto by any means.

(PAG3-1)

(PAG3-2)

(PAG3-3)

(PAG3-4)

(PAG3-5)

(PAG3-6)

(PAG3-7)

(PAG3-8)

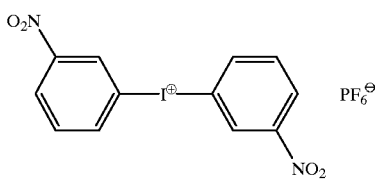

(PAG3-9)

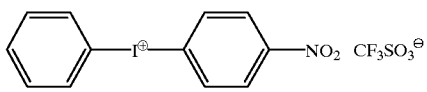

(PAG3-10)

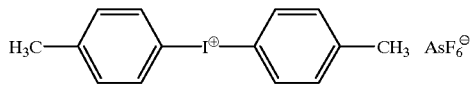

(PAG3-11)

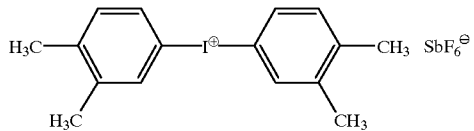

(PAG3-12)

(PAG3-13)

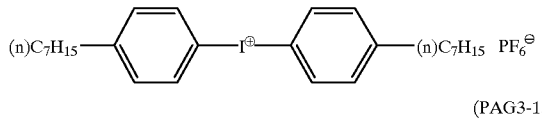

(PAG3-14)

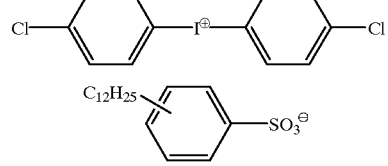

(PAG3-15)

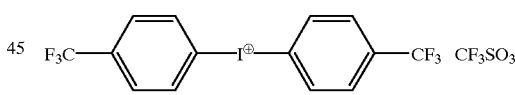

(PAG3-16)

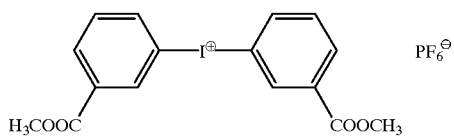

(PAG3-17)

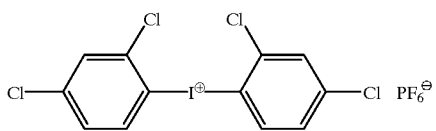

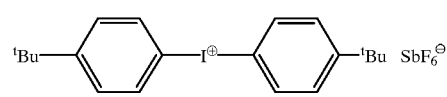

(PAG3-18)
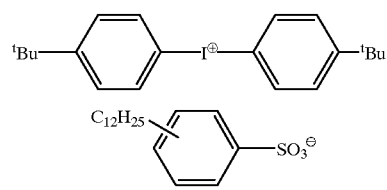
(PAG3-19)
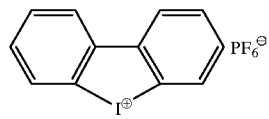
(PAG3-20)
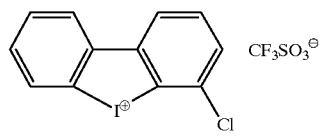
(PAG3-21)
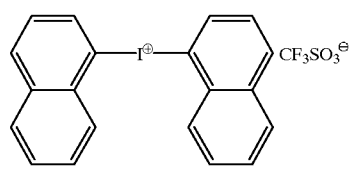
(PAG3-22)
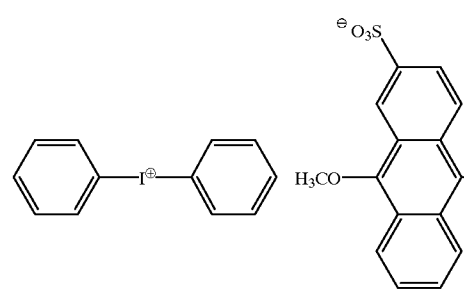
(PAG3-23)
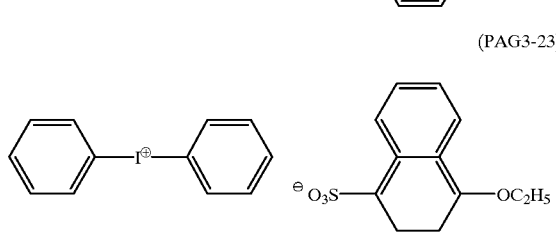
(PAG3-24)
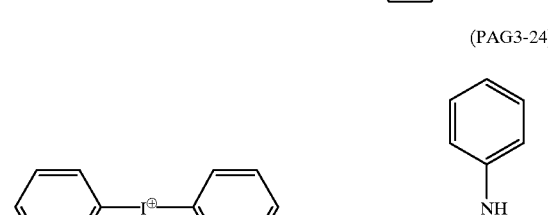
(PAG3-25)
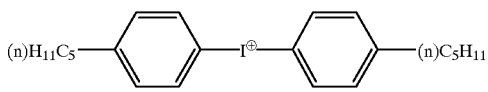
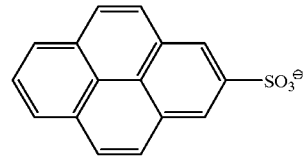
(PAG3-26)
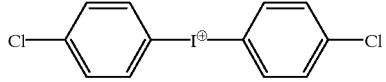
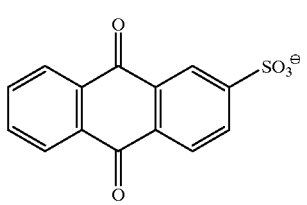
(PAG3-27)
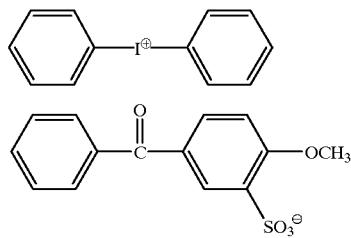
(PAG4-1)
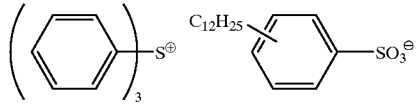
(PAG4-2)
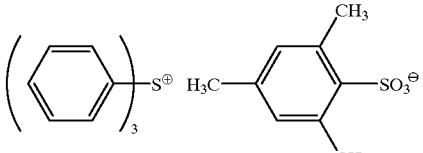
(PAG4-3)
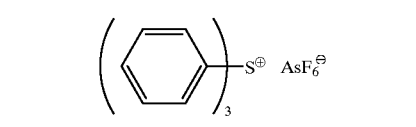
(PAG4-4)
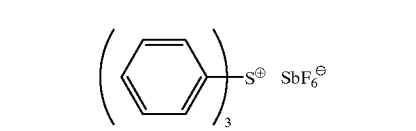
(PAG4-5)
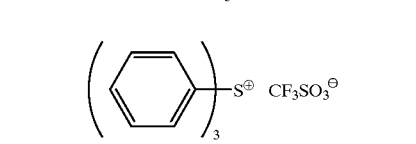

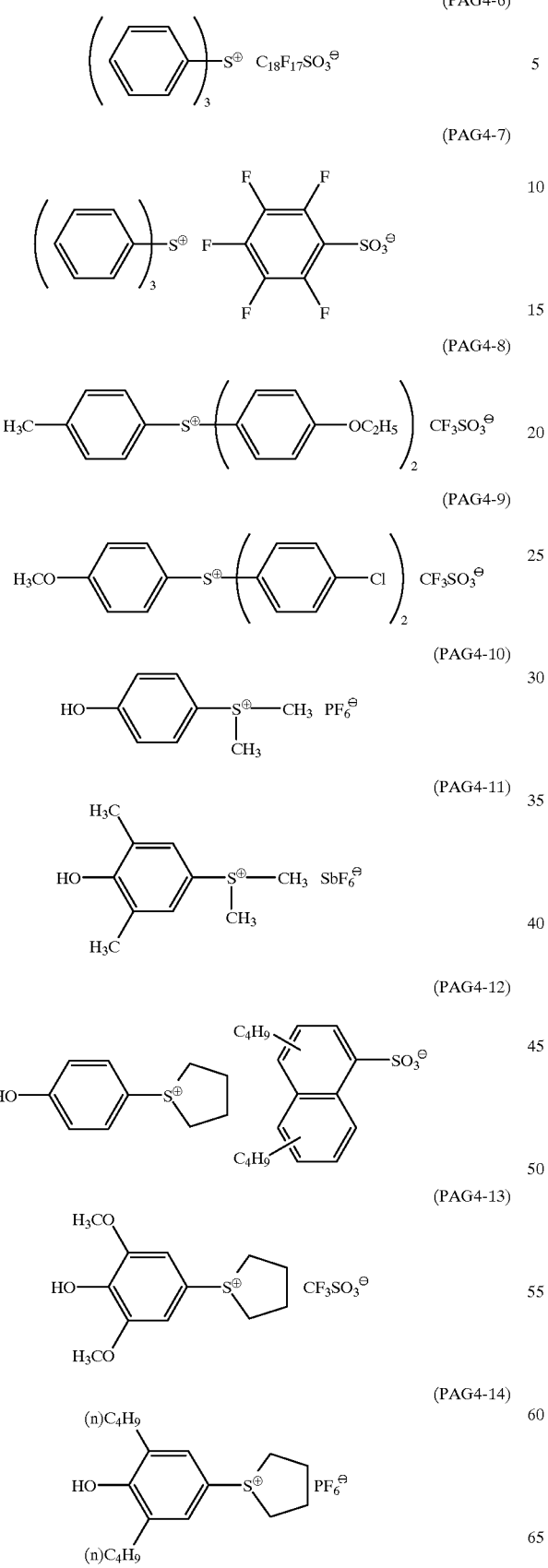
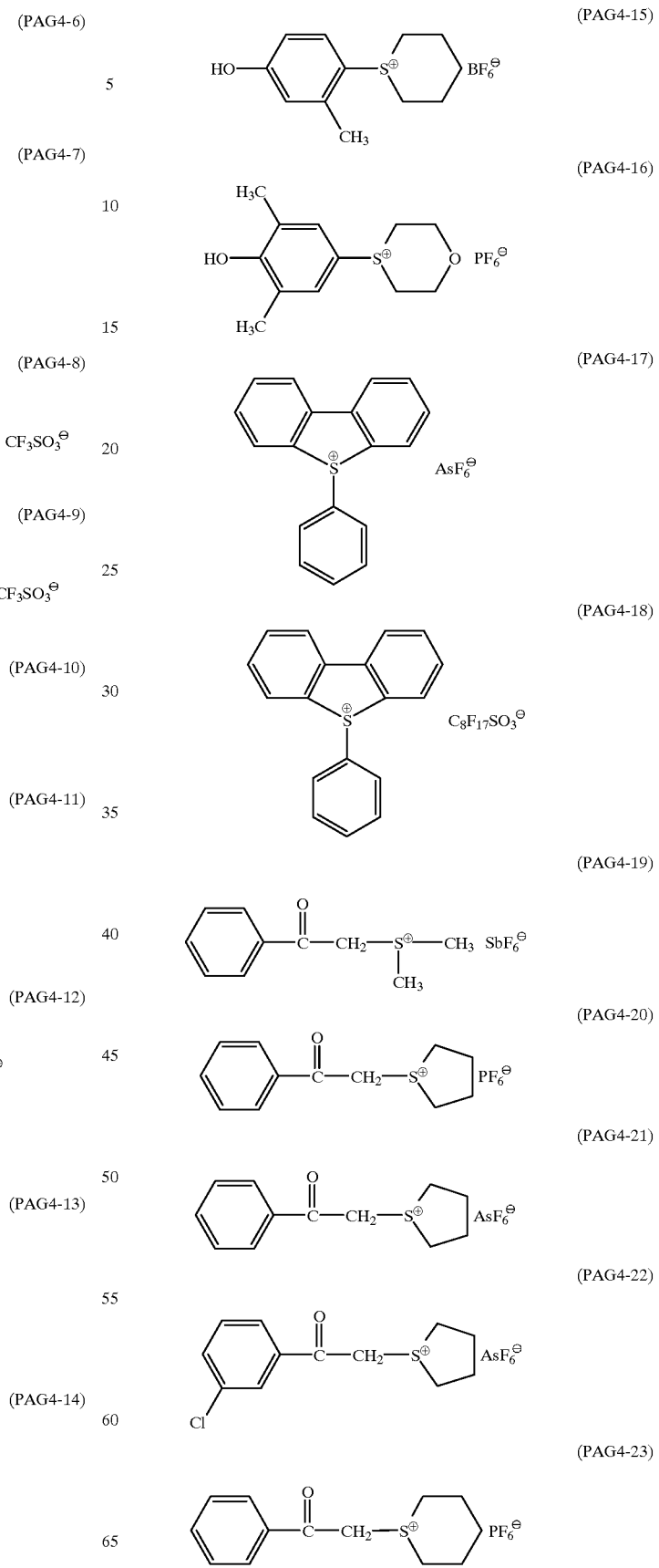

(PAG4-24)
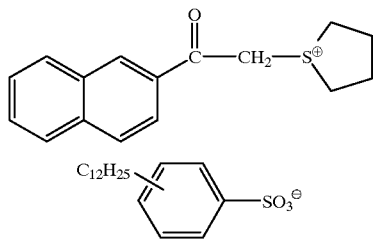

(PAG4-25)
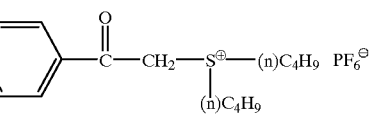

(PAG4-26)
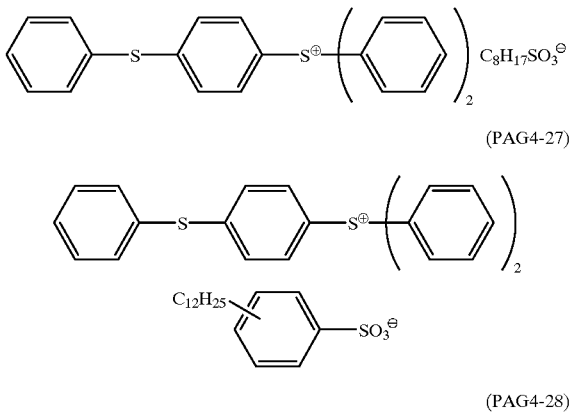

(PAG4-27)

(PAG4-28)
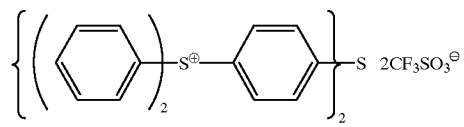

(PAG4-29)
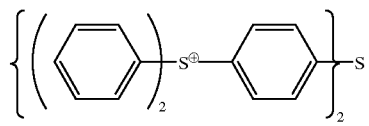

(PAG4-30)
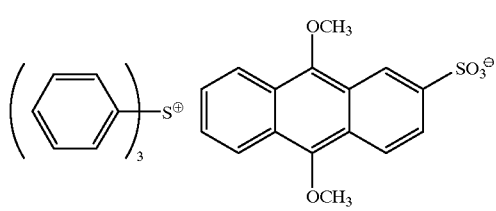

(PAG4-31)
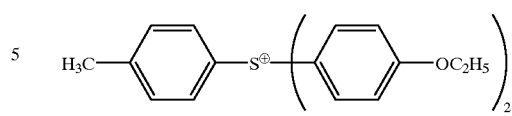

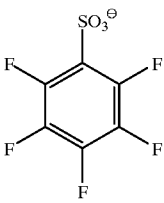

(PAG4-32)
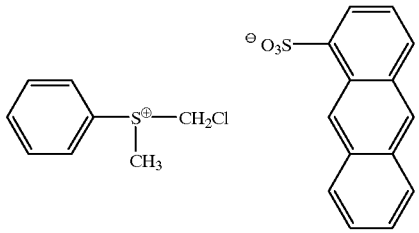

(PAG4-33)
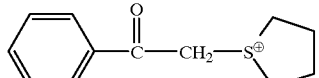
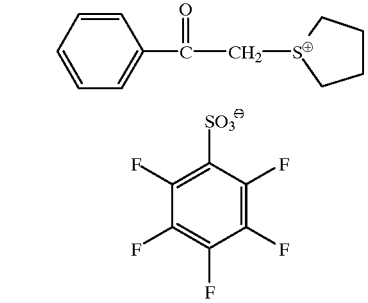

(PAG4-34)
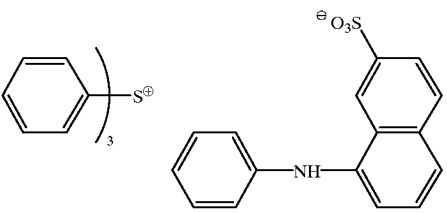

The onium salts represented by formulae (PAG3) and (PAG4) are known and can be synthesized by the method described, for example, in J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polym. Chem. Ed.*, 18, 2677 (1980), U.S. Pat. Nos. 2,807,648 and 4,247,473, and JP-A-53-101331.

(3) Disulfone Derivative represented by Formula (PAG5) or Iminosulfonate Derivative represented by Formula (PAG6)

(PAG5)
$$Ar^3-SO_2-SO_2-Ar^4$$

(PAG6)

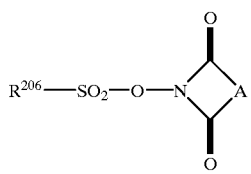

wherein Ar³ and Ar⁴ each independently represents a substituted or unsubstituted aryl group, $R^{206}$ represents a substituted or unsubstituted alkyl group or aryl group, and A represents a substituted or unsubstituted alkylene group, alkenylene group or arylene group.

Specific examples thereof include the following compounds, however, the present invention is by no means limited thereto.

(PAG5-1)

(PAG5-2)

(PAG5-3)

(PAG5-4)

(PAG5-5)

(PAG5-6)

(PAG5-7)

(PAG5-8)

(PAG5-9)
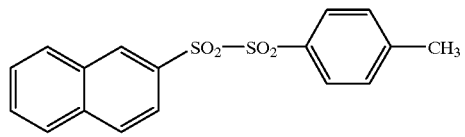

(PAG5-10)
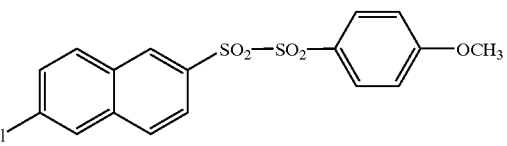

(PAG5-11)
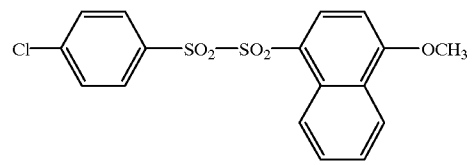

(PAG5-12)
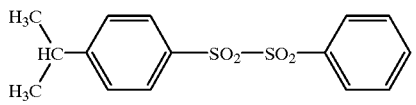

(PAG5-13)
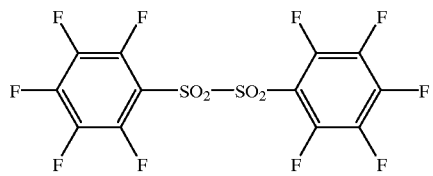

(PAG5-14)
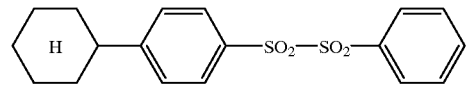

(PAG5-15)
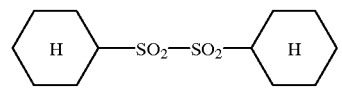

(PAG6-1)
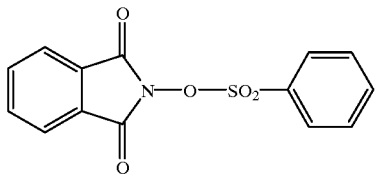

(PAG6-2)
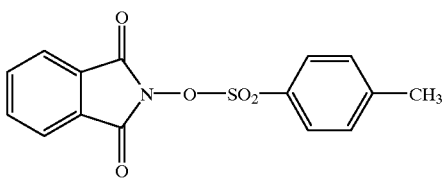

(PAG6-3)
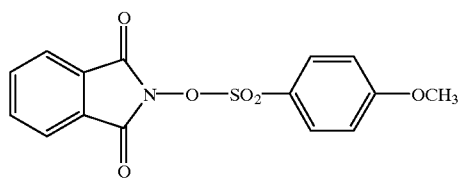
(PAG6-4)
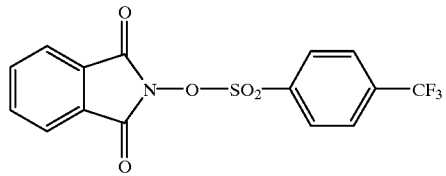
(PAG6-5)
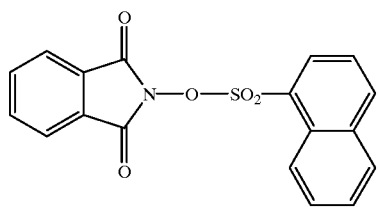
(PAG6-6)
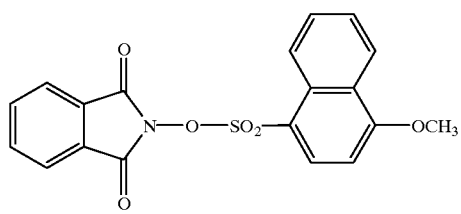
(PAG6-7)
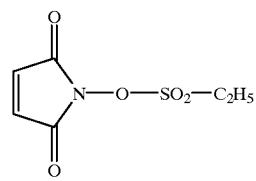
(PAG6-8)
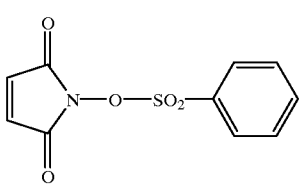
(PAG6-9)
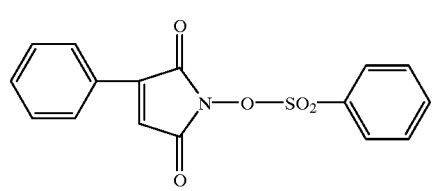
(PAG6-10)
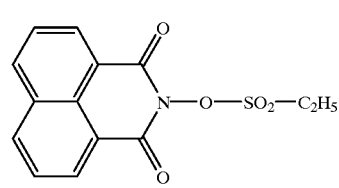
(PAG6-11)
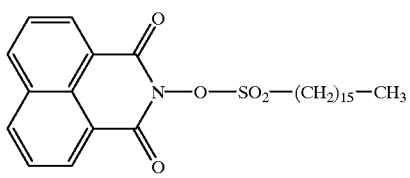
(PAG6-12)
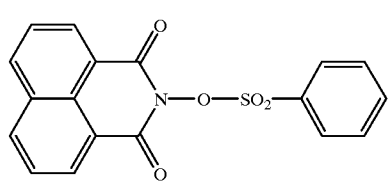
(PAG6-13)
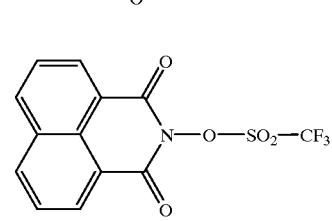
(PAG6-14)
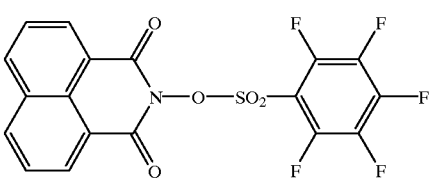
(PAG6-15)
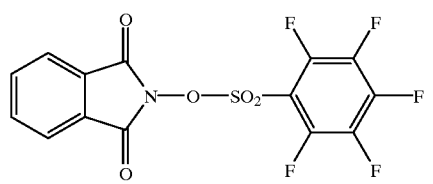
(PAG6-16)
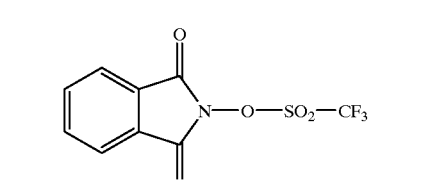
(PAG6-17)
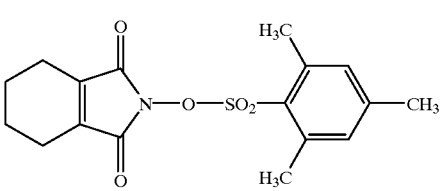
(PAG6-18)
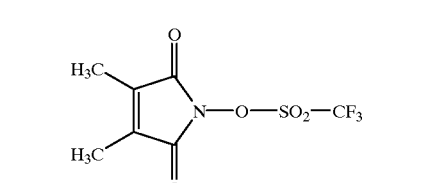

-continued (PAG6-19)

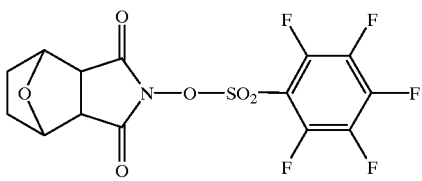

The added amount of the compound which decomposes on irradiation of an active light ray or radiation and generates an acid is usually from 0.001 to 40 wt %, preferably from 0.01 to 20 wt %, more preferably from 0.1 to 5 wt %, based on the entire weight of the positive resist composition (excluding the coating solvent). If the added amount of the compound which decomposes on irradiation of an active light ray or radiation and generates an acid is less than 0.001 wt %, the sensitivity is reduced, whereas if the added amount exceeds 40 wt %, the resist exhibits too high light absorption and this causes disadvantageous effects such as bad profile or narrow process (particularly bake) margin.

[5] Other Components for Use in the Present Invention

The positive photosensitive composition of the present invention may further contain, if desired, an acid decomposable dissolution inhibiting compound, a dye, a plasticizer, a surface active agent, a photosensitizer, an organic basic compound, a compound which accelerates the solubility in a developer, and the like.

The acid decomposable dissolution inhibiting compound for use in the present invention is a low molecular weight compound containing at least one acid decomposable group represented by formula (XIII) or (XIV) and having a molecular weight of 3,000 or less. In order to prevent reduction in the transmissibility particularly at 220 nm or less, an alicyclic or aliphatic compound such as cholic acid derivatives described in *Proceeding of SPIE*, 2724, 355 (1996) is preferred. In the present invention, when the acid decomposable dissolution inhibiting compound is used, the added amount thereof is from 3 to 50 wt %, preferably from 5 to 40 wt %, more preferably from 10 to 35 wt %, based on the entire weight of the composition (excluding the solvent).

The compound for accelerating the dissolution in a developer, which can be used in the present invention, is a low molecular weight compound containing two or more phenolic OH groups or one or more carboxyl group and having a molecular weight of 1,000 or less. In the case where the compound contains a carboxyl group, an alicyclic or aliphatic compound is preferred from the same reason as described above.

The amount of the dissolution accelerating compound added is preferably from 2 to 50 wt %, more preferably from 5 to 30 wt %, based on the resin as component (B). If the added amount exceeds 50 wt %, the development residue acts adversely or a new problem disadvantageously arises that the pattern deforms at the development.

The above-described phenol compound having a molecular weight of 1,000 or less can be easily synthesized by one skilled in the art by referring to the method described, for example, in JP-A-4-122938, JP-A-2-28531, U.S. Pat. No. 4,916,210 and European-Patent 219294.

Specific examples of the phenol compound are described below, however, the compounds which can be used in the present invention are not limited thereto by any means.

Resorcinol, phloroglucinol, 2,3,4-trihydroxybenzophenone, 2,3,4,4'-tetrahydroxybenzophenone, 2,3,4,3',4',5'-hexahydroxybenzophenone, acetone-pyrogallol condensed resin, phloroglucocide, 2,4,2',4'-biphenyltetrol, 4,4'-thiobis(1,3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenylsulfone, tris(4-hydroxyphenyl)methane, 1,1-bis(4-hydroxyphenyl)cyclohexane, 4,4-(α-methylbenzylidene)bisphenol, α,a,α',α"-tris(4-hydroxyphenyl)-1,3,5-triisopropylbenzene, α,α',α"-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)propane, 2,2,5,5-tetrakis(4-hydroxyphenyl)hexane, 1,2-tetrakis(4-hydroxyphenyl)ethane, 1,1,3-tris(hydroxyphenyl)butane and para[α,α,α',α'-tetrakis(4-hydroxyphenyl)]xylene.

The organic basic compound which can be used in the present invention is preferably a compound having basicity stronger than the phenol, more preferably a nitrogen-containing basic compound.

The preferred chemical environment thereof includes the following structures (A) to (E).

(A)

wherein $R^{250}$, $R^{251}$ and $R^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbons atoms, and $R^{251}$ and $R^{252}$ may combine with each other to form a ring;

(B)

(C)

(D)

(E)

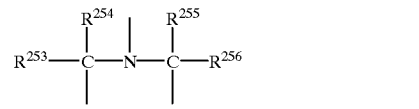

wherein $R^{253}$, $R^{254}$, $R^{255}$ and $R^{256}$, which may be the same or different, each represents an alkyl group having from 1 to 6 carbon atoms.

More preferred is a nitrogen-containing basic compound containing two or more nitrogen atoms of different chemical environments in one molecule, still more preferred is a compound containing both a ring structure having a substituted or unsubstituted amino group and a ring structure having a nitrogen atom, or a compound having an alkylamino group. Preferred specific examples thereof include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine and a substituted or unsubstituted aminoalkylmorpholine. The substituent is preferably an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group or a cyano group. More preferred examples of the compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl) piperazine, N-(2-aminoethyl)piperizine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine, however, the present invention is by no means limited thereto.

These nitrogen-containing basic compounds are used individually or in combination of two or more thereof. The amount of the nitrogen-containing basic compound used is usually from 0.001 to 10 parts by weight, preferably from 0.01 to 5 parts by weight, per 100 parts by weight of the photosensitive resin composition (excluding the solvent). If the amount used is less than 0.001 part by weight, the effect owing to the addition of the nitrogen-containing basic compound cannot be obtained, whereas if it exceeds 10 parts by weight, reduction in the sensitivity or deterioration in the developability of the unexposed area is liable to occur.

Suitable dyes include an oily dye and a basic dye. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all are produced by Orient Chemical Industries Co., Ltd.), Crystal Violet (CI42555), Methyl Violet (CI42535), Rhodamine B (CI45170B), Malachite Green (CI42000) and Methylene Blue (CI52015).

In order to improve acid generation ratio on exposure, a photosensitizer may be added. Specific examples of suitable photosensitizers include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzyl, Acridine Orange, benzoflavin, Setoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin) and coronene, however, the present invention is by no means limited thereto.

These photosensitizers may also be used as a light absorbent of far ultraviolet light from the light source. In this case, the light absorbent-reduces the reflected light from the substrate and decreases the influence of multiple reflection within the resist layer, thereby exerting the effect of improving the standing wave.

The positive resist composition of the present invention is dissolved in a solvent which can dissolve the above-described respective components, and then coated on a support. The solvent used here is preferably ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone or tetrahydrofuran. These solvents are used individually or in combination.

To this solvent, a surface active agent may be added. Specific examples thereof include a nonionic surface active agent, for example, polyoxyethylene alkyl ethers such as polyoxyethylene lauryl ether, polyoxyethylene stearyl ether, polyoxyethylene cetyl ether and polyoxyethylene oleyl ether, polyoxyethylene alkylaryl ethers such as polyoxyethylene octylphenol ether and polyoxyethylene nonylphenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; a fluorine-base surface active agent such as Eftop EF301, EF303, EF352 (all produced by Shin-Akita Kasei KK), Megafac F171, F173 (both produced by Dainippon Ink & Chemicals, Inc.), Florad FC430, FC431 (both produced by Sumitomo 3M Limited), Asahiguard AG710, Surflon S-382, SC101, SC102, SC103, SC104, SC105 and SC-106 (all produced by Asahi Glass Co., Ltd.); and Organosiloxane Polymer KP-341 (produced by Shin-Etsu Chemical Co., Ltd.), and acrylic acid-base or methacrylic acid-base (co)polymer Polyflow No. 75 and No. 95 (both produced by Kyoeisha Yushi Kagaku Kogyo KK). The amount of the surface active agent mixed is usually 2 parts by weight or less, preferably 1 part by weight or less, per 100 parts by weight of the solids content in the composition of the present invention.

These surface active agents may be used individually or some may be added in combination.

The above-described positive resist composition is coated on a substrate (e.g., silicon/silicon dioxide coating) for use in the production of a precision integrated circuit element by an appropriate coating method such as spinner or coater, exposed through a predetermined mask, baked and developed to thereby obtain a good resist pattern.

After the coating, heat treatment is preferably performed for drying the coating and forming a film. By this heat treatment, the resin as component (B) and the compound as component (C) form a crosslinked structure. The heating temperature is preferably 80° C. or higher, more preferably 100° C. or higher, still more preferably from 120 to 160° C., and the heating time is preferably 30 seconds or more, more preferably 1 minute or more, still more preferably from 1 to 10 minutes.

The exposure light is preferably a far ultraviolet beam having a wavelength of 250 nm or less, more preferably 220 nm or less. Specific examples thereof include KrF excimer laser (248 nm), ArF excimer laser (193 m), $F_2$ excimer laser (157 nm), X ray and electron beam.

The developer which can be used for the positive resist composition of the present invention is an alkaline aqueous solution of inorganic alkalis such as sodium hydroxide, potassium hydroxide, sodium carbonate, sodium silicate, sodium metasilicate and aqueous ammonia, primary amines such as ethylamine and-n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, and cyclic amines such as pyrrole and piperidine.

To the alkaline aqueous solution, an appropriate amount of an alcohol or surface active agent may be added.

The present invention is described in greater detail below, however, the present invention should not be construed as being limited thereto.

SYNTHESIS EXAMPLE 1
Synthesis of Compound (d5)

16.0 g (0.40 mol) of NaH (content: 60%) was dispersed in 200 ml of N,N-dimethylacetamide, and thereto, 48.0 g (0.20 mol) of 2,2-bis(4-hydroxycyclohexyl)propane was added at room temperature. Further, 42.6 g (0.40 g) of 2-chloroethyl vinyl ether was added dropwise over 30 minutes. The resulting mixed solution was stirred under heating at 100° C. for 5 hours. The reaction mixture obtained was allowed to cool, poured into 1.5L of water and extracted with 500 ml of ethyl acetate. The extract was washed with water, dried over sodium sulfate and then dried. The dried ethyl acetate solution was concentrated and purified by column chromatography (filler: silica gel, eluent: hexane/ethyl acetate=4/1) to obtain 39.7 g of a colorless liquid. This liquid was verified by NMR to be Compound (d5) as component (C) of the present invention.

SYNTHESIS EXAMPLE 2
Synthesis of Compound (d35)

34.2 g of a colorless liquid was obtained in the same manner as in Synthesis Example 1 except for using 39.2 g (0.20 mol) of bis(hydroxymethyl)tricyclo[5.2.1.0$^{2,6}$]decane in place of 2,2-bis(4-hydroxycyclohexyl)propane of Synthesis Example 1. This liquid was verified by NMR to be Compound (d35) as component (C) of the present invention.

SYNTHESIS EXAMPLE 3
Synthesis of Compound (d39)

31.5 g of a colorless liquid was obtained in the same manner as in Synthesis Example 1 except for using 33.6 g (0.20 mol) of 1,3-dihydroxyadamantane in place of 2,2-bis (4-hydroxycyclohexyl)propane of Synthesis Example 1. This liquid was verified by NMR to be Compound (d39) as component (C) of the present invention.

SYNTHESIS EXAMPLE 4
Synthesis of Compound (d20)

44.5 g (0.20 mol) of isophorone diisocyanate was dissolved in 200 ml of dioxane and thereto, 35.2 g (0.40 mol) of 2-hydroxyethyl vinyl ether was added. Further, 0.2 g of dibutyltin dilauryl ester as a catalyst was added. The resulting mixed solution was stirred under heating at 100° C. for 5 hours. The reaction mixture obtained was allowed to cool, poured into 1.5L of water and extracted with 500 ml of ethyl acetate. The extract was washed with water, dried over sodium sulfate and then dried. The dried ethyl acetate solution was concentrated and purified by column chromatography (filler: silica gel, eluent: hexane/ethyl acetate=3/1) to obtain 48.6 g of a white solid. This solid was verified by NMR to be Compound (d20) as component (C) of the present invention.

SYNTHESIS EXAMPLE 5
Synthesis of Compound (d31)

36.4 g (0.20 mol) of 5-norbornene-2,3-dicarboxylic acid and 54.5 g (0.40 mol) of 2-hydroxyethylvinylsulfone were dissolved in 300 ml of THF. To the resulting solution, a THF 100 ml solution containing 82.5 g of dicyclohexylcarbodiimide was added dropwise over one hour. The resulting mixed solution was stirred at room temperature for 3 hours and then stirred at 50° C. for 3 hours. The solid precipitated was filtered and a THF solution of the filtrate was concentrated and purified by column chromatography (filler: silica gel, eluent: hexane/ethyl acetate=4/1) to obtain 52.4 g of a white solid. This solid was verified by NMR to be Compound (d31) as component (C) of the present invention.

SYNTHESIS-EXAMPLE 6
Synthesis of Resin (p-1)

A mixture of 13.2 g (0.060 mol) of tricyclodecanyl methacrylate/3.4 g (0.040 mol) of methacrylic acid was dissolved in 60 ml of 1-methoxy-2-propanol and thereto, 50 mg of 2,2'-azobis(2,4-dimethylvaleronitrile) as a polymerization initiator (V-65, trade name, produced by Wako Pure Chemical Industries Ltd.) was added at 70° C. while stirring in a nitrogen stream. 50 mg of the same initiator was further added 2 hours and 4 hours after the initiation of reaction. After the reaction for further 3 hours, the temperature was elevated to 90° C. and stirring was continued for one hour. The reaction solution was allowed to cool and then poured into 1 L of ion exchanged water while vigorously stirring. As a result, a polymer was precipitated. The polymer obtained was dried at 40° C. under reduced pressure to obtain 13.9 g of Resin (p-1). The molecular weight determined by GPC was, in terms of a weight average (Mw: polystyrene basis), $32.4 \times 10^3$ (dispersion degree (Mw/Mn): 2.7).

SYNTHESIS EXAMPLE 7
Synthesis of Resin (p-2) of the Present Invention 14.7 g of Resin (p-2) was obtained in the same manner as in Synthesis Example 6 except for using 13.2 g (0.060 mol) of 1-adamantane methacrylate in place of tricyclodecanyl methacrylate of Synthesis Example 6. The molecular weight determined by GPC was, in terms of a weight average (Mw: polystyrene basis), $35.3 \times 10^3$ (dispersion degree (Mw/Mn): 2.8).

SYNTHESIS EXAMPLE 8
Synthesis of Resin (p-3) of the Present Invention 14.3 g of Resin (p-3) was obtained in the same manner as in Synthesis Example 6 except for dissolving a mixture of 11.0 g (0.050 mol) of tricyclodecanyl methacrylate/2.8 g (0.020 mol) of t-butyl methacrylate/2.6 g (0.030 mol) of methacrylic acid in 60 ml of 1-methoxy-2-propanol. The molecular weight determined by GPC was, in terms of a weight average (Mw: polystyrene basis), $37.1 \times 10^3$ (dispersion degree (Mw/Mn): 2.8).

SYNTHESIS EXAMPLES 9 TO 19
Synthesis of Resins of the Present Invention

The resins of the present invention shown in Table 1 below were synthesized in the same manner as in Synthesis Examples 6 to 8. The molar ratio of monomers fed and the weight-average molecular weight of the resins produced are also shown in Table 1.

TABLE 1

Synthesis of Resins of the Present Invention

| Synthesis Example | Resin of the Invention | Monomers Used (mol % ratio) | Weight-average Molecular Weight (dispersion degree) |
|---|---|---|---|
| 9 | (p-4) | tricyclodecanyl methacrylate/(i)/methacrylic acid (50/25/25) | $38.4 \times 10^3$ (2.9) |
| 10 | (p-5) | (a)/methacrylic acid (60/40) | $33.6 \times 10^3$ (2.8) |
| 11 | (p-6) | (a)/(h)/methacrylic acid (50/25/25) | $39.4 \times 10^3$ (2.9) |
| 12 | (p-7) | (a)/(i)/methacrylic acid (50/30/20) | $37.6 \times 10^3$ (2.8) |
| 13 | (p-8) | (b)/(c) (50/50) | $38.8 \times 10^3$ (3.0) |
| 14 | (p-9) | (d)/(e) (50/50) | $41.5 \times 10^3$ (3.0) |
| 15 | (p-10) | (f)/(g) (50/50) | $46.2 \times 10^3$ (3.1) |
| 16 | (p-11) | 1-adamantane methacrylate/(h)/methacrylic acid (50/25/25) | $37.4 \times 10^3$ (2.9) |
| 17 | (p-12) | 1-adamantane methacrylate/(i)/methacrylic acid (50/30/20) | $36.2 \times 10^3$ (2.9) |
| 18 | (p-13) | isophoronyl methacrylate/t-butyl methacrylate/methacrylic acid (50/20/30) | $29.8 \times 10^3$ (2.8) |
| 19 | (p-14) | isophoronyl methacrylate/(i)/methacrylic acid (50/30/20) | $28.5 \times 10^3$ (2.7) |

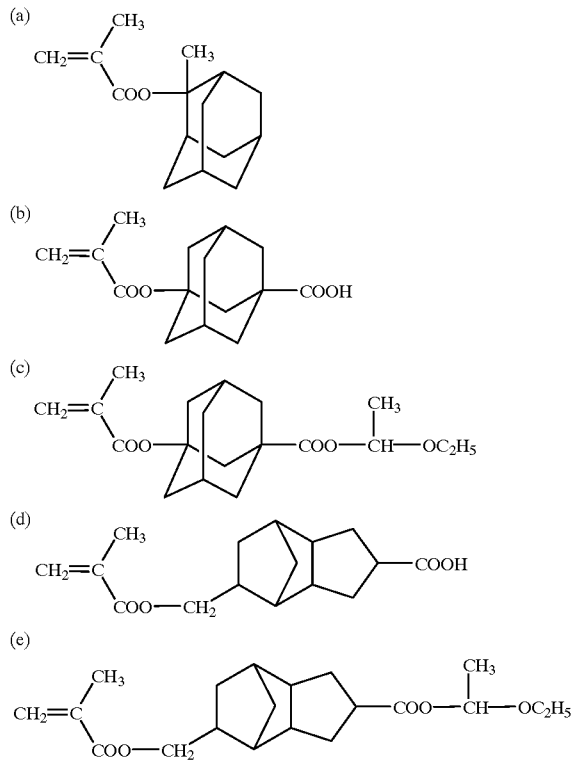

EXAMPLE 1

(Measurement of Thermal Crosslinking Property and Optical Density)

1.0 g of the resin shown in Table 2 below as component (B), 0.35 g of the compound shown in Table 2 below as component (C) of the present invention and 0.01 g of triphenylsulfonium triflate were dissolved in 6.0 g of propylene glycol monomethyl ether acetate. The resulting mixed solution was filtered through a Teflon filter of 0.2 μm, uniformly coated on a quartz glass substrate by a spin coater and dried by heating on a hot plate at 130° C. for 2 minutes to form a resist film having a thickness of 1 μm.

For evaluating the crosslinking property, the film obtained was dipped in a 2.38% aqueous tetramethylammonium hydroxide solution for 1 minute. The film thickness loss was 5% or less in any case and the resist films all were proved to have satisfactory crosslinking property.

Further, the optical absorption per 1 μm of each film obtained was measured by an ultraviolet spectrophotometer and the optical density at 193 nm determined is shown in Table 2 below.

TABLE 2

Results of Optical Density Measurement
of Resins of the Present Invention

| Resin of the Invention | Compound (C) of the Invention | Optical Density at 193 nm (/$\mu$m) |
|---|---|---|
| (p-1) | (d5) | 0.33 |
| (p-2) | (d8) | 0.34 |
| (p-4) | (d17) | 0.35 |
| (p-5) | (d20) | 0.34 |
| (p-6) | (d21) | 0.33 |
| (p-8) | (d5) | 0.33 |
| (p-9) | (d35) | 0.32 |
| (p-10) | (d39) | 0.33 |
| (p-12) | (d42) | 0.32 |
| (p-13) | (d45) | 0.36 |
| poly(hydroxystyrene) (Comparison) | — | 1.5 or more |

It is seen from Table 2 that the resins of the present invention are smaller in the optical density value measured than the value of poly(hydroxystyrene) for comparison and proved to have a sufficiently high transmissivity to the light at 193 nm.

EXAMPLE 2
(Measurement of Resistance against Dry Etching)

The compositions of the present invention shown in Example 1 each was uniformly coated on a silicon substrate and heated on a hot plate at 130° C. for 2 minutes in the same manner as in Example 1, to form a resist film having a thickness of 0.7 $\mu$m. The film obtained was measured on the etching rate by $CF_4/O_2$ (8/2) gas using a reactive ion etching apparatus (CSE-1110, manufactured by ULVAC) and the results are shown in Table 3 below (etching condition: power: 500 W, pressure: 4.6 Pa, gas flow rate: 10 sccm).

TABLE 3

Results of Dry Etching Rate Measurement
of Resins of the Present Invention

| Resin of the Invention | Compound (C) of the Invention | Etching Rage (Å/min) |
|---|---|---|
| (p-1) | (d5) | 830 |
| (p-2) | (d8) | 900 |
| (p-4) | (d17) | 860 |
| (p-5) | (d20) | 810 |
| (p-6) | (d21) | 850 |
| (p-8) | (d5) | 800 |
| (p-9) | (d35) | 790 |
| (p-10) | (d39) | 810 |
| (p-12) | (d42) | 830 |
| (p-13) | (d45) | 870 |
| poly(methyl methacrylate) (Comparison) | | 1250 |

It is seen from Table 3 that the compositions of the present invention are smaller in the etching rate than the value in the case of using poly(methyl methacrylate) for comparison and proved to have a sufficiently high resistance against dry etching.

EXAMPLE 3
(Evaluation of Image)

1.0 g of the resin shown in Table 4 below as component (B) of the present invention, 0.35 g of the compound shown in Table 4 below as component (C) of the present invention and 0.01 g of triphenylsulfonium triflate were dissolved in 6.0 g of propylene glycol monomethyl ether acetate. The mixed solution was filtered through a Teflon filter of 0.2 $\mu$m, uniformly coated on a silicon substrate treated with hexamethyl disilazane by a spin coater and then dried by heating on a hot plate at 130° C. for 2 minutes to form a resist film having a thickness of 0.4 $\mu$m. On the thus-formed resist film, a mask prepared by drawing a pattern on a quartz plate by chromium was tightly contacted and thereon an ArF excimer laser beam (193 nm) was irradiated. Immediately after the exposure, the coating was heated on a hot plate at 110° C. for 60 seconds, developed by dipping it in a 2.38% aqueous tetramethylammonium hydroxide solution at 23° C. for 60 seconds, rinsed with pure water for 30 seconds and then dried. The pattern obtained was observed through a scanning-type electron microscope and patterns in the rectangular form were evaluated good.

The sensitivity was defined as the exposure amount necessary for reproducing a mask pattern of 0.35 $\mu$m.

The resolution was defined as the limiting resolution with the exposure amount necessary for reproducing a mask pattern of 0.35 $\mu$m.

The results of the pattern form, sensitivity and resolution are shown in Table 4.

TABLE 4

Sensitivity, Resolution and Pattern Form of Resist Film
using Resin of the Present Invention

| Resin of the Invention | Compound (C) of the Invention | Sensitivity (mJ/cm$^2$) | Resolution ($\mu$m) | Pattern Form |
|---|---|---|---|---|
| (p-1) | (d5) | 32 | 0.25 | Good |
| (p-4) | (d17) | 30 | 0.25 | Good |
| (p-6) | (d21) | 28 | 0.25 | Good |
| (p-8) | (d5) | 24 | 0.25 | Good |
| (p-9) | (d35) | 26 | 0.25 | Good |
| (p-10) | (d39) | 23 | 0.25 | Good |
| (p-12) | (d42) | 33 | 0.25 | Good |

It is seen from the results in Table 4 that the resists using the resin and the compound of the present invention have high sensitivity and good resolution and give good pattern form. Further, even with a developer in a conventional concentration (an aqueous tetramethylammonium hydroxide solution), development was successfully achieved, film thickness loss and deterioration in adhesion did not occur, and good pattern form, high sensitivity and excellent resolution could be obtained.

Resins (p-15) to (p-34) as component (B) for use in the positive resist composition were synthesized in Synthesis Examples 20 to 39. Then, each resin was combined with the compound as component (A) in Examples 4 to 6 to prepare a positive resist composition. In Example 4, the thermal crosslinking property and optical density of the composition was measured, in Example 5, the resistance against dry etching was measured and in Example 6, the image was evaluated.

The compound as component (C) synthesized in the Synthesis Examples was selected from the chemical formulae illustrated above. Resins (p-15) to (p-34) as component (B) were prepared by copolymerizing repeating units illustrated above. The compound as component (C) and the repeating units selected in each synthesis are shown by the reference numeral (e.g., d5, a3) affixed to the chemical formulae illustrated.

SYNTHESIS EXAMPLE 20
Synthesis of Resin (p-15) as Component (B) having Structural Units of (a'2)/(a'7)

0.40 g (0.001 mol) of tungsten hexachloride was weighed and dissolved with 200 ml of chlorobenzene in a nitrogen stream. To the resulting solution, 2.28 g (0.003 mol) of a 15% toluene solution of triethylammonium was added dropwise while stirring in a nitrogen stream. Further, 300 ml of a chlorobenzene solution-containing 152 g (1.00 mol) of 2-carboxymethoxynorbornene was added thereto and stirring was continued thereafter at 30° C. for 20 hours. The resulting reaction solution was poured in 4L of methanol while stirring to precipitate a polymer. The polymer produced was separated by filtration and dried at 40° C. under reduced pressure to yield 144 g. This polymer was dissolved in 500 ml of THF and thereto 5 g of Pd/C (10% Pd) as a catalyst was added. Further, an ethanol 100 ml solution containing 80 g of hydrazine monohydrate was added thereto and the mixed solution was stirred under heating at 80° C. for 5 hours. The catalyst was separated by filtration and the reaction solution was poured into 3L of methanol while stirring. Then, a white polymer was precipitated.

The polymer produced was separated by filtration and dried at 40° C. under reduced pressure to yield 142 g. 15.4 g of this polymer was dispersed in 200 ml of methanol and 18.3 g of a 25% aqueous tetramethylammonium OH salt solution was added thereto. The resulting mixed solution was refluxed under heating for 5 hours and the reaction solution obtained was diluted with methanol/ion exchanged water and then neutralized with concentrated hydrochloric acid. The polymer precipitated was separated by filtration, thoroughly washed with ion exchanged water and then dried at 40° C. under reduced pressure. As a result, 13.5 g of white resin (resin (p-15) as component (B)) was obtained. The molecular weight determined by GPC was, in terms of the weight average (Mw: polystyrene basis), $5.4 \times 10^3$. Further, the molar ratio of the structural units (a'2)/(a'7) was determined by NMR and found to be 55145.

SYNTHESIS EXAMPLES 21 TO 27
Synthesis of Resins (p-16) to-(p-22) as Component (B)

The resins (p-16) to (p-22) as component (B) were synthesized in the same manner as in Synthesis Example 20. The structure, the compositional ratio and the molecular weight of the resins are shown in Table 5 below.

TABLE 5

Synthesis of Resins of the Present Invention

| Synthesis Example | Resin of the Invention | Monomers Used (mol % ratio) | Weight-average Molecular Weight |
|---|---|---|---|
| 21 | (p-16) | (a'3)/(a'34) (50/50) | $7.4 \times 10^3$ |
| 22 | (p-17) | (a'4)/(a'33) (40/60) | $6.5 \times 10^3$ |
| 23 | (p-18) | (a'12)/(a'30) (50/50) | $8.3 \times 10^3$ |
| 24 | (p-19) | (a'14)/(a'43) (60/40) | $9.6 \times 10^3$ |
| 25 | (p-20) | (a'15)/(a'29) (50/50) | $8.6 \times 10^3$ |
| 26 | (p-21) | (a'16)/(a'32)/(a'34) (30/35/35) | $7.3 \times 10^3$ |
| 27 | (p-22) | (a'15)/(a'37) (50/50) | $12.2 \times 10^3$ |

SYNTHESIS EXAMPLE 28
Synthesis of Resin (p-23) as Component (B) having Structural Units of (a'48)/(a'51)

0.50 g of palladium chloride and 41.1 g of AgBF were stirred in 40 ml of acetonitrile at room temperature for one hour. The solid precipitated was separated by filtration and the reaction solution was concentrated. Thereto, anhydrous ethyl ether was added, and the yellow solid precipitated was separated by filtration and then recrystallized from acetonitrile/ethyl ether to obtain 21.1 g of an addition-polymerization catalyst [Pd(MeCN)$_6$](BF$_4$). 1.0 g of the catalyst was dissolved in 200 ml of a nitromethane solution and thereto 30.4 g (0.20 mol) of 2-carbomethoxynorbornene was added. The resulting mixed solution was continuously stirred at room temperature for 24 hours. The reaction solution was concentrated under reduced pressure and the polymer obtained was thoroughly washed with acetonitrile. This polymer was dried and then dispersed in 200 ml of methanol and thereto 36.5 g of a 25% aqueous tetramethylammonium OH salt solution was added. The mixed solution was refluxed under heating for 5 hours and the reaction solution obtained was diluted with methanol/ion exchanged water and then neutralized with concentrated hydrochloric acid.

The polymer precipitated was separated by filtration, thoroughly washed with ion exchanged water and then dried at 40° C. under reduced pressure. As a result, 26.7 g of white resin (resin (p-23) as component (B)) was obtained. The molecular weight determined by GPC was, in terms of the weight average (Mw: polystyrene basis), $8.4 \times 10^3$. Further, the molar ratio of the structural units (a'48)/(a'51) was determined by NMR and found to be 52/48.

SYNTHESIS EXAMPLES 29 TO 34
Synthesis of Resins (p-24) to (p-29) as Component (B)

The resins (p-24) to (p-29) as component (B) were synthesized in the same manner as in Synthesis Example 28. The structure, the compositional ratio and the molecular weight of the resins are shown in Table 6 below.

TABLE b

Synthesis of Resins of the Present Invention

| Synthesis Example | Resin of the Invention | Monomers Used (mol % ratio) | Weight-average Molecular weight |
|---|---|---|---|
| 29 | (p-24) | (a'49)/(a'51) (50/50) | $9.4 \times 10^3$ |
| 30 | (p-25) | (a'50)/(a'51) (55/45) | $8.6 \times 10^3$ |
| 31 | (p-26) | (a'48)/(a'53) (50/50) | $8.2 \times 10^3$ |
| 32 | (p-27) | (a'50)/(a'54) (50/50) | $7.8 \times 10^3$ |
| 33 | (p-28) | (a'55)/(a'69) (50/50) | $6.9 \times 10^3$ |
| 34 | (p-29) | (a'51)/(a'55)/(a'71) (35/30/35) | $9.5 \times 10^3$ |

SYNTHESIS EXAMPLE 35
Synthesis of Resin (p-30) as Component (B) having Structural Units of (a'46)/(b14)

A mixture of 47.1 g (0.50 mol) of norbornene/49.0 g (0.50 mol) of maleic anhydride was dissolved in 300 ml of THF and thereto, 1.0 g of 2,2'-azobis(2,4-dimethylvaleronitrile) as a polymerization initiator (V-65, trade name, produced by Wako Pure Chemical Industries Ltd.) was added at 65° C. while stirring in a nitrogen stream. 1.0 g of the same initiator was further added 2 hours and 4 hours after the initiation of reaction. After the reaction for further 3 hours, the temperature was elevated to 90° C. and stirring was continued for one hour. The reaction solution was allowed to cool and then poured into 4L of ion exchanged water while vigorously stirring. As a result, a polymer was precipitated. The polymer obtained was dried at 40° C. under reduced pressure. 19.2 g of this polymer was dissolved in 100 ml of N,N-dimethylacetamide and thereto 11.0 g (0.11 mol) of cyclohexanol and 23.7 g (0.30 mol) of pyridine were added. The resulting mixed solution was stirred under heating at 90° C. for 3 hours and the reaction solution obtained was allowed to cool and then poured into 1L of ion exchanged water while vigorously stirring. As a result, a polymer was precipitated.

The polymer obtained was dried at 40° C. under reduced pressure and then, 27.5 g of white resin was obtained. The molecular weight determined by GPC was, in terms of a weight average (Mw: polystyrene basis), $14.5 \times 10^3$. Further, the molar ratio of the structural units (a'46)/(b14) was determined by NMR and found to be 50/50.

SYNTHESIS EXAMPLES 36 TO 39

Synthesis of Resins (p-31) to (p-34) as Component (B)

The resins (p-31) to (p-34) as component (B) were synthesized in the same manner as in Synthesis Example 35. The structure, the compositional ratio and the molecular weight of the resins are shown in Table 7 below.

TABLE 7

Synthesis of Resins of the Present Invention

| Synthesis Example | Resin of the Invention | Monomers Used (mol % ratio) | Weight-average Molecular weight |
| --- | --- | --- | --- |
| 36 | (p-31) | (a'49)/(b14) (50/50) | $15.4 \times 10^3$ |
| 37 | (p-32) | (a'71)/(b13) (50/50) | $19.6 \times 10^3$ |
| 38 | (p-33) | (a'49)/(a'55)/(b14) (25/25/50) | $17.8 \times 10^3$ |
| 39 | (p-34) | (a'56)/(b13)/(c1) (35/35/30) | $14.9 \times 10^3$ |

EXAMPLE 4

(Measurement of Thermal Crosslinking Property and Optical Density, 1.0 g of the resin shown in Table 8 below as component (B), 0.35 g of the compound shown in Table 8 below as component (C) and 0.01 g of triphenylsulfonium triflate were dissolved in 6.0 g of propylene glycol monomethyl ether acetate. The resulting mixed solution was filtered through a Teflon filter of 0.2 μm, uniformly coated on a quartz glass substrate by a spin coater and dried by heating on a hot plate at 130° C. for 2 minutes to form a resist film having a thickness of 1 μm.

For evaluating the crosslinking property, the film obtained was dipped in a 2.38% aqueous tetramethylammonium hydroxide solution for 1 minute. The film thickness loss was 5% or less in any case and the resist films all were proved to have sufficiently high crosslinking property.

Further, the optical absorption of each film obtained was measured by an ultraviolet spectrophotometer and the optical density at 193 nm determined is shown in Table 8 below.

TABLE 8

Results of Optical Density Measurement of Resins of the Present Invention

| Resin of the Invention | Compound (C) of the Invention | Optical Density at 193 nm (/μm) |
| --- | --- | --- |
| (p-15) | (d5) | 0.31 |
| (p-17) | (d8) | 0.33 |
| (p-19) | (d18) | 0.33 |
| (p-20) | (d21) | 0.33 |
| (p-23) | (d22) | 0.31 |
| (p-24) | (d5) | 0.32 |
| (p-26) | (d35) | 0.33 |
| (p-30) | (d39) | 0.31 |
| (p-31) | (d42) | 0.32 |
| (p-33) | (d45) | 0.33 |
| poly(hydroxystyrene) (Comparison) | | 1.5 or more |

It is seen from Table 8 that the resins as component (B) are smaller in the optical density value measured than the value of poly(hydroxystyrene) (weight-average molecular weight: $15.1 \times 10^3$) and proved to have a sufficiently high transmissivity to the light at 193 nm.

EXAMPLE 5
(Measurement of Resistance against Dry Etching)

The compositions of the present invention shown in Example 4 each was uniformly coated on a silicon substrate and heated on a hot plate at 130° C. for 2 minutes in the same manner as in Example 4, to form a resist film having a thickness of 0.7 μm. The film obtained was measured on the etching rate by $CF_4/O_2$ (8/2) gas using a reactive ion etching apparatus (CSE-1110, manufactured by ULVAC) and the results are shown in Table 9 below (etching condition: power: 500 W, pressure: 4.6 Pa, gas flow rate: 10 sccm).

TABLE 9

Results of Dry Etching Rate Measurement of Resins of the Present Invention

| Resin of the Invention | Compound (C) of the Invention | Etching Rate (Å/min) |
| --- | --- | --- |
| (p-16) | (d5) | 670 |
| (p-17) | (d8) | 710 |
| (p-19) | (d18) | 690 |
| (p-20) | (d21) | 680 |
| (p-21) | (d22) | 700 |
| (p-24) | (d5) | 710 |
| (p-26) | (d35) | 690 |
| (p-29) | (d39) | 670 |
| (p-31) | (d42) | 680 |
| (p-33) | (d45) | 720 |
| poly(methyl methacrylate) (Comparison) | | 1250 |

It is seen from Table 9 that the resins as component (B) are smaller in the etching rate than the value of poly(methyl methacrylate) (weight-average molecular weight: $35.5 \times 10^3$) and proved to have a sufficiently high resistance against dry etching.

EXAMPLE 6
(Evaluation of Image)

1.0 g of the resin shown in Table 10 below as component (B), 0.35 g of the compound shown in Table 10 below as component (C) and 0.01 g of triphenylsulfonium triflate were dissolved in 6.0 g of propylene glycol monomethyl ether acetate. The mixed solution was filtered through a Teflon filter of 0.2 μm, uniformly coated on a silicon substrate treated with hexamethyl disilazane by a spin coater and then dried by heating on a hot plate at 130° C. for 2 minutes to form a resist film having a thickness of 0.4 μm. On the thus-formed resist film, a mask prepared by drawing a pattern on a quartz plate by chromium was tightly contacted and thereon an ArF excimer laser beam (193 nm) was irradiated. Immediately after the exposure, the coating was heated on a hot plate at 110° C. for 60 seconds, developed by dipping it in a 2.38% aqueous tetramethylammonium hydroxide solution at 23° C. for 60 seconds, rinsed with pure water for 30 seconds and then dried. The pattern obtained was observed through a scanning-type electron microscope and patterns in the rectangular form were evaluated good.

The sensitivity was defined as the exposure amount necessary for reproducing a mask pattern of 0.35 μm.

The resolution was defined as the limiting resolution with the exposure amount necessary for reproducing a mask pattern of 0.35 μm.

The results of the pattern form, sensitivity and resolution are shown in Table 10.

TABLE 10

Sensitivity, Resolution and Pattern Form of Resist Film using Resin of the Present Invention

| Resin of the Invention | Compound (C) of the Invention | Sensitivity (mJ/cm$^2$) | Resolution (μm) | Pattern Form |
|---|---|---|---|---|
| (p-16) | (d5) | 34 | 0.25 | Good |
| (p-17) | (d18) | 35 | 0.25 | Good |
| (p-20) | (d22) | 37 | 0.25 | Good |
| (p-21) | (d5) | 33 | 0.25 | Good |
| (p-26) | (d35) | 35 | 0.25 | Good |
| (p-29) | (d39) | 33 | 0.25 | Good |
| (p-31) | (d42) | 36 | 0.25 | Good |

With the sensitivity and resolution shown in Table 10, good positive patterns where only the exposed area of the resist film was dissolved and removed, were formed.

It is seen from Table 10 that the resists using the resin and the compound of the present invention have high sensitivity and good resolution and give good pattern form. Further, even with a developer in a conventional concentration (an aqueous tetramethylammonium hydroxide solution), development was successfully achieved, film thickness loss and deterioration in adhesion did not occur, and good pattern form, high sensitivity and excellent resolution could be obtained.

As described in the foregoing, according to the present invention, a positive resist composition suitable for the exposure using a light source of 220 nm or less, particularly an ArF excimer laser beam (193 nm) can be obtained.

More specifically, the positive resist composition ensures, on use of a far ultraviolet ray of 220 nm or less as the exposure light source, high transmissivity, high sensitivity, good resolution, sufficiently high resistance against dry etching, satisfactory adhesion to the substrate, and superior developability even with a developer conventionally used for resists (for example, a 2.38% aqueous tetramethylammonium hydroxide solution). Accordingly, the positive resist composition can be effective used in the formation of a fine pattern necessary for producing a semiconductor device.

While the invention has been described in detail and with reference to specific embodiments thereof, it will be apparent to one skilled in the art that various changes and modifications can be made therein without departing from the spirit and scope thereof.

What is claimed is:

1. A positive resist composition exposable using far ultraviolet radiation having a wavelength of 220 nm or less, comprising (A) a compound generating an acid on irradiation with an active light ray or radiation, (B) a resin having a polycyclic alicyclic group and a carboxyl group, said resin being selected from the group consisting of (1) resins having at least one repeating structural unit having a polycyclic alicyclic group on a side chain thereof represented by the following formula (XXII), (XXIII) or (XXIV), and (2) resins containing at least one repeating structural unit having an alicyclic group on the main chain represented by the following formula (II) or (III), and (C) a compound represented by the following formula (XIV):

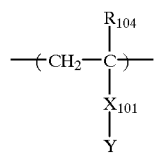

(XXII)

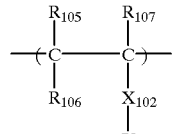

(XXIII)

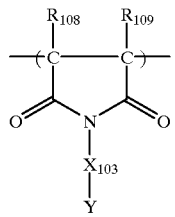

(XXIV)

wherein $R_{104}$, $R_{105}$, $R_{107}$, $R_{108}$ and $R_{109}$ may be the same or different and each represents a hydrogen atom, a halogen atom, a cyano group, an alkyl group or haloalkyl group which groups optionally have a substituent; $R_{106}$ represents a cyano group, —CO—O$R_{110}$ or —CO—N($R_{111}$)($R_{112}$); $X_{101}$, $X_{102}$ and $X_{103}$ may be the same or different and each represents a single bond, a divalent alkylene group, alkenylene group or cycloalkylene group which groups optionally have a substituent, —O—, —SO$_2$—, —CO—$R_{113}$—, —CO—O—$R_{114}$— or —CO—N($R_{115}$)—$R_{116}$—; $R_{110}$ represents a hydrogen atom, an alkyl group, cycloalkyl group or alkenyl group which groups optionally have a substituent, or a group capable of decomposing by the action of an acid to increase solubility of the resin in an alkali developer; $R_{111}$, $R_{112}$ and $R_{115}$ may be the same or different and each represents a hydrogen atom, an alkyl group, cycloalkyl group or alkenyl group which groups optionally have a substituent, or $R_{111}$ and $R_{112}$ may be combined to form a ring; $R_{113}$, $R_{114}$, and $R_{116}$ may be the same or different and each represents a single bond or a divalent alkylene group, alkenylene group or cycloalklene group which may have an ether group, an ester group, an amido group, a urethane group or a ureido group; and Y represents a polycyclic alicyclic group;

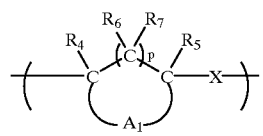

(II)

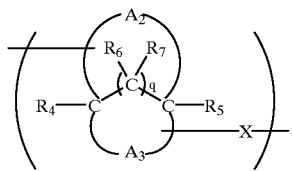

(III)

wherein $R_4$, $R_5$, $R_6$ and $R_7$ each independently represents a hydrogen atom, a halogen atom, a cyano group a hydroxy group, an alkyl group, a haloalkyl group, an alkoxy group, —CO—$OR_{38}$ or a carboxy group, or at least two of $R_4$ to $R_7$ may be combined to form an alklene group having from 1 to 5 carbon atoms which may contain a hetero atom; $R_{38}$ represents an alkyl group, cyloalkyl group or alkenyl group which may have a substituent, or a group capable of decomposing by the action of an acid; $A_1$, $A_2$ and $A_3$ each independently represents a divalent alkylene group, alkenylene group or monocyclic or polycyclic cycloalkylene group which may have a substituent; X represents a single bond, a divalent alkylene group an alkenylene group or —$SO_2$—: and p and q each independently represents 0 or an integer from 1 to 4; and

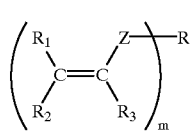

(XIV)

wherein $R_1$, $R_2$ and $R_3$ may be the same or different and each represents a hydrogen atom or an alkyl group or cycloalkyl group which groups optionally have a substituent or two of $R_1$ to $R_3$ may be combined to form a ring structure comprising from 3 to 8 carbon atoms or hetero atoms; Z represents an oxygen atom, a sulfur atom, —$SO_2$— or —NH—; R represents an m-valent alkylene group, m-valent cycloalkylene group or m-valent group obtained by combining two or more of these groups, which may contain a hetero atom and may form a divalent or greater valent linking group together with at least one of an ether group, an ester group, an amido group, a urethane group or a ureido group, and m represents an integer of 2 or more;

and wherein the resin as component (B) and the compound as component (C) are crosslinked, and the crosslinked product of the resin as component (B) and the compound as component (C) is insoluble in an alkali developer and is decomposable by the acid generated on irradiation with an active light ray or radiation to increase the solubility of the crosslinked product in an alkali developer.

2. The positive resist composition as claimed in claim 1, wherein the resin as component (B) is a polycycloolefin resin having an alicyclic group on the main chain and having a carboxyl group.

3. The positive resist composition as claimed in claim 1, wherein the resin as component (B) further contains a group capable of decomposing by the action of an acid to increase solubility in an alkali developer.

4. The positive resist composition as claimed in claim 3, wherein the repeating structural unit having an alicyclic group on the main chain, represented by formula (II) or (III), is a repeating structural unit represented by the following formula (IV), (V), (VI), (VII) or (VIII):

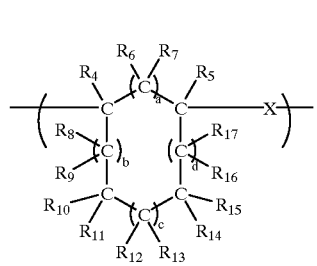

(IV)

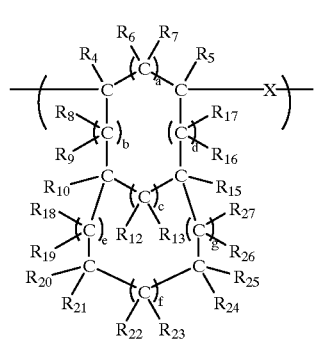

(V)

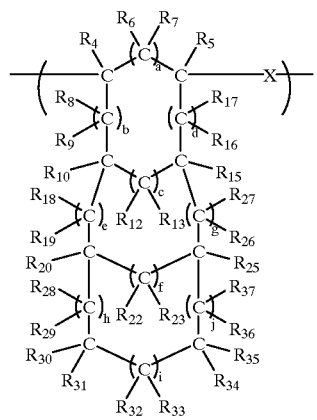

(VI)

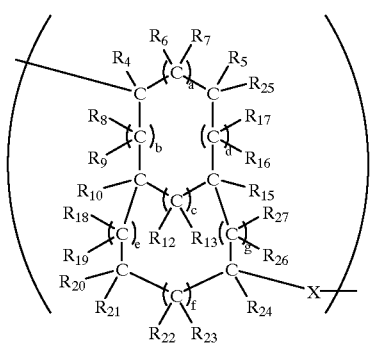

(VII)

(VIII)

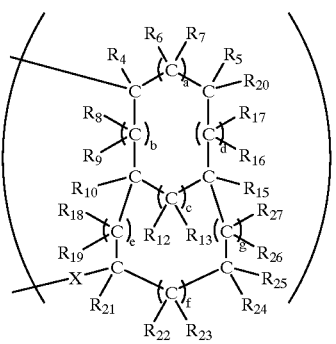

wherein $R_4$ to $R_7$, $R_{38}$ and X each has the same meaning as defined in claim 2; $R_8$ to $R_{37}$ each independently represents a hydrogen atom, a halogen atom, a hydroxy group, an alkoxy group, an alkyl group, a cycloalkyl group, an alkenyl group, —CO—$OR_{38}$ or a carboxy group; a to j each independently represents 0 or an integer from 1 to 4; and at least two of $R_4$ to $R_{17}$ in formula (IV), at least two of $R_4$ to $R_{10}$, $R_{12}$, $R_{13}$, and $R_{15}$ to $R_{27}$ in formula (V), (VII) or (VIII), or at least two of $R_4$ to $R_{10}$, $R_{12}$, $R_{13}$, $R_{15}$ to $R_{20}$, $R_{22}$, $R_{23}$ and $R_{25}$ to $R_{37}$ in formula (VI) may be combined to form an alkylene group having from 1 to 5 carbon atoms, which may contain a hetero atom.

5. The positive resist composition as claimed in claim 1, wherein the resin as component (B) contains at least one repeating structural unit having a carboxyl group, represented by the following formula (IX), (X) or (XI):

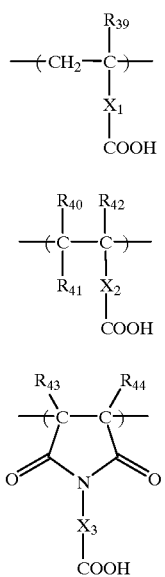

(IX)

(X)

(XI)

wherein $R_{39}$ to $R_{40}$ and $R_{42}$ to $R_{44}$ each independently represents a hydrogen atom, a halogen atom, a cyano group, an alkyl group or a haloalkyl group; $R_{41}$ represents a cyano group, —CO—$OR_{38}$ or —CO—$NR_{45}R_{46}$; $X_1$ to $X_3$ each independently represents a single bond, a divalent alkylene group, alkenylene group or cycloalkylene group which groups optionally have a substituent, —O—, —$SO_2$—, —O—CO—$R_{47}$—, —CO—O—$R_{48}$— or —CO—$NR_{49}$—$R_{50}$—; $R_{38}$ has the same meaning as defined in claim 1; $R_{45}$, $R_{46}$ and $R_{49}$ each independently represents a hydrogen atom, an alkyl group, cycloalkyl group or alkenyl group which groups optionally have a substituent and $R_{45}$ and $R_{46}$ may be combined to form a ring; $R_{47}$, $R_{48}$ and $R_{50}$ each independently represents a single bond, a divalent alkylene group, an alkenylene group, a cycloalkylene group or a divalent group formed therefrom together with at least one of an ether group, an ester group, an amido group, a urethane group or a ureido group.

6. The positive resist composition as claimed in claim 1, wherein the resin as component (B) has a group represented by the following formula (XII) or (XIII):

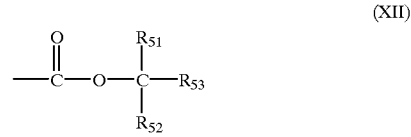

(XII)

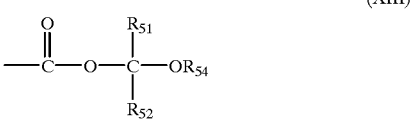

(XIII)

wherein $R_{51}$ to $R_{53}$ each independently represents a hydrogen atom or an alkyl group, cycloalkyl group, alkenyl group, acyl group or alkoxycarbonyl group which groups optionally have a substituent, and $R_{54}$ represents an alkyl group, cycloalkyl group or alkenyl group which groups optionally have a substituent, provided that at least two of $R_{51}$, to $R_{53}$ in formula (XII) are a group other than a hydrogen atom or two of $R_{51}$ to $R_{53}$ in formula (XII) or two of $R_{51}$, $R_{52}$ and $R_{54}$ in formula (XIII) may be combined to form a ring structure comprising from 3 to 8 carbon atoms or hetero atoms.

7. The positive resist composition as claimed in claim 1, wherein the resin as component (B) has a hydroxyl group.

* * * * *